United States Patent [19]
Hackett et al.

[11] Patent Number: 5,585,863
[45] Date of Patent: Dec. 17, 1996

[54] MEMORY ORGANIZING AND ADDRESSING METHOD FOR DIGITAL VIDEO IMAGES

[75] Inventors: James I. Hackett, Victor; Mark D. Brown, Rochester; David M. Charneski, Hilton, all of N.Y.

[73] Assignee: Eastman Kodak Company, Rochester, N.Y.

[21] Appl. No.: 418,734

[22] Filed: Apr. 7, 1995

[51] Int. Cl.$^6$ .................................................. H04N 5/907
[52] U.S. Cl. ........................ 348/716; 348/718; 345/200; 345/203
[58] Field of Search .................................. 348/716, 714, 348/717, 718, 513, 571; 345/186, 188, 200, 201, 203, 126, 189, 190; 395/164, 165, 166; H04N 9/64, 5/907

[56] References Cited

U.S. PATENT DOCUMENTS

| | | | |
|---|---|---|---|
| 4,460,958 | 7/1984 | Christopher et al. | 364/200 |
| 4,587,559 | 5/1986 | Longacre, Jr. et al. | 358/160 |
| 4,602,275 | 7/1986 | Smith et al. | 358/11 |
| 4,746,979 | 5/1988 | Kashigi | 358/22 |
| 4,800,431 | 1/1989 | Deering | 358/160 |
| 4,806,920 | 2/1989 | Sawada | 345/126 |
| 4,870,491 | 9/1989 | Ishii | 358/160 |
| 4,980,765 | 12/1990 | Kudo et al. | 358/160 |
| 5,010,324 | 4/1991 | Yamamoto | 345/126 |
| 5,111,192 | 5/1992 | Kadakia | 345/203 |
| 5,153,726 | 10/1992 | Billing | 358/160 |
| 5,195,182 | 3/1993 | Sasson | 358/909 |
| 5,315,388 | 5/1994 | Shen et al. | 348/714 |
| 5,371,519 | 12/1994 | Fischer | 345/203 |

Primary Examiner—Safet Metjahic
Assistant Examiner—Jeffrey S. Murrell
Attorney, Agent, or Firm—Edward Dugas

[57] ABSTRACT

A method for organizing and addressing memory of a digital video image is provided for one and two dimensional image processing using fast page mode accessing of memory, and also for displaying composite digital video images. A DRAM (12) is mapped to address locations storing segmented memory, non-segmented memory, line pointer tables, and horizontal description tables. The lines of a digital image are organized in DRAM (12) in either segmented memory or non-segmented memory. For segmented memory, each line of the image is broken up into equal line segments of pixels. Vertically aligned columns of line segments in the image are then stored in one or more rows of the DRAM (12). For non-segmented memory, each line is stored in a format where rows of DRAM (12) each represent a line of image data. To provide a means of locating the lines of the image, a line pointer table is stored in the DRAM (12) having entries corresponding to the location in memory of the start of each line of the image, and an indicator in each entry indicating whether a line is segmented or non-segmented. Two dimensional processing of an image in segmented memory is facilitated by fast page mode accessing since both vertical and horizontal pixel information is obtainable in a single row address of DRAM (12). In addition, a horizontal description table provides a means of displaying a composite image without forming the composite image in DRAM (12). Each composite image is divided into zones of rectangular pixel regions, and then separated into sets of lines having one or more zones. For each set of lines, a horizontal description table describes how the pixels in the zones for that set are to be displayed.

19 Claims, 16 Drawing Sheets

|  | COL 0 | COL 1 | • • • • | COL N |
|---|---|---|---|---|
| ROW 0 | PIXEL R0 C0 | PIXEL R0 C1 | | PIXEL R0 CN |
| ROW 1 | PIXEL R1 C0 | | | |
| • | | | | |
| • | | | | |
| • | | | | |
| ROW M | PIXEL RM C0 | | | PIXEL RM CN |

FIG. 2
(prior art)

| | | | | |
|---|---|---|---|---|
| ROW 0 | LINE SEGMENT 0 OF LINE 0 | LINE SEGMENT 0 OF LINE 1 | LINE SEGMENT 0 OF LINE 2 | • • • | LINE SEGMENT 0 OF LINE M |
| ROW 1 | LINE SEGMENT 1 OF LINE 0 | LINE SEGMENT 1 OF LINE 1 | LINE SEGMENT 1 OF LINE 2 | • • • | LINE SEGMENT 1 OF LINE M |
| • • • • • | | | | | |
| ROW M | LINE SEGMENT N OF LINE 0 | LINE SEGMENT N OF LINE 1 | LINE SEGMENT N OF LINE 2 | • • • | LINE SEGMENT N OF LINE M |

FIG. 4

MEMORY ORGANIZING AND ADDRESSING METHOD FOR DIGITAL VIDEO IMAGES

FIELD OF INVENTION

The present invention relates generally to a method for organizing and addressing memory of digital video images, and particularly, to an improved method for organizing and addressing memory of digital images for facilitating one and two dimensional image processing, and forming composite digital images.

BACKGROUND OF THE INVENTION

A digital image referred to herein is made up of a two dimensional array of pixel elements on a display. These pixels appear as dots forming the image. Such images have various pixel array sizes, such as 256×512 pixel or 512×1024 pixels. Each pixel of an image may be represented as digital values providing intensity and color. Also, a digital image may be composed of channels, such as RGB or YCC, where each pixel has a value for each channel of an image.

Digital image processing systems have utilized fast page mode accesses of standard dynamic random access memories (DRAM's) to implement high speed image processing operations. The pixel data of a digital image however does not itself record the position of the pixel on the image. Position data has been maintained by mapping the location of the pixels into DRAM memory locations where successive blocks of memory called row addresses are provided for each line of an image, and in each row address the pixel sequence for the line is maintained by storing pixel data at consecutive column addresses. This is shown in FIG. 2 for an image having M lines, and N pixels in each line.

It has been conventional to access a digital video image from DRAM (also called "Video DRAM") by a fast page mode access technique. In a fast page mode access of the image, a row address is issued to the DRAM at the beginning of a line of the image, and each fast page mode column access within a row will correspond to the address of data representing the pixels which compose that line. In this manner, multiple column addresses can be read or written to DRAM, without the overhead of reissuing row addresses to the DRAM devices.

The above described scheme for accessing digital images may be adequate for operations which require performing processing on neighboring pixels in a line of the image. However, if two dimensional operations require performing processing on pixels from above and below the same column position, but from two different lines of the image, system performance suffers. Operations such as digital spatial filtering, two dimensional convolution kernels, and bi-linear interpolation require two dimensional processing. Under these circumstances, both a row address and column address must be issued to the DRAM devices to access pixels in the same column, but different rows. Thus, fast page mode accesses are not feasible, and system performance is severely impacted.

To overcome this limitation, line storage buffers are often used to perform two dimensional processing. Two dimensional image processing operations may be broken down into a horizontal operation, and then a vertical operation. Fast page mode addressing is employed during the horizontal processing step. As the pixels are fast page mode accessed by column addresses for processing, the pixels are stored into a First-In-First-Out (FIFO) line storage buffer (see FIG. 3). Once stored, the pixels will be available for processing after the next line of image data is fast page mode accessed. If more than two lines of data are required for a given two dimensional processing operation, additional FIFO buffers are used. The output of one FIFO buffer then becomes the input of the next, and multiple pixels with identical column positions can be simultaneously accessed in the vertical processing step of the operation.

One drawback to the use of line storage buffer is that full line length FIFO buffers significantly slows down processing relative to the fast page mode access of an entire row of DRAM. For example, in an image 512 pixels wide where 8 data bits represent each pixel, a total of 4096 bits (512×8) must be stored in a buffer before each vertical two dimensional processing step. This slows processing between each fast page mode access of DRAM.

Another drawback to the line storage buffer approach is that implementing full length line buffers on an integrated circuit chip (IC) requires large amounts of Static Random Access Memory (SRAM). SRAM on an IC needs a great deal of area, and also increases power consumption. This results in increase costs to implement two dimensional image processing on an IC.

Further, it is often desired in digital video processing to generate a digital image from sections of other digital images. This type of digital image is called a composite image. To create a composite digital image, the pixels from sections of other images are organized in a DRAM in the above described row and column organization. This then allows fast page mode accessing of the composite image from memory. A shortcoming of this technique is that it slows down processing and increases memory usage since the composite image must be stored in DRAM before imaging or subsequent image processing can be performed.

SUMMARY OF THE INVENTION

An object of this invention is to provide an improved method of organizing and addressing memory for stored digital image that does not require full line length memory buffers for two dimensional processing.

A further object of the invention is to provide an improved method of accessing memory to obtain information on multiple pixels in adjacent column positions of an image using a single fast page mode access of a DRAM row.

Still another object of the invention is to provide an improved method for accessing memory for displaying composite images without forming the composite image in memory.

Briefly described there is provided in accordance with the invention a method for organizing and addressing memory of a digital image composed of data representing successive lines of pixels of the image. The method includes the steps of: storing the digital image in a first memory corresponding to the data representing the lines of pixels. Then each line of the image is segmented in the first memory into line segments, wherein each line segment represents an equal number of the pixels. Once the lines are segmented, the image now has consecutive columns of line segments. Line segments of one column of the image are then selected in successive order, and stored in that successive order in one or more rows of a second memory.

Further in accordance with the invention, the method includes creating a line pointer table in the second memory having data representing the location in second memory of the first line segment in each segmented line of the image. Then the line segments may be read from the second memory using fast page mode accessing where the line pointer table provides the location of the first line segment in one of the segmented lines. The read line segments may be stored into one of a plurality of data buffers, and then processing performed on the pixels of the line segments in the buffers. The resulting processed line segments in the second memory are stored in the same successive order in the same rows of the second memory.

In accordance with still a further object of the invention there is provided a method for displaying a digital image composed of a two dimensional array of pixel elements having representative display values, using a digital processor and memory accessible by the processor, where the memory stores data representing successive horizontal lines of the pixel elements for one or more digital images. The method includes the steps of: horizontally dividing the image into rectangular zones of pixel regions, and then separating the lines of the image into sets of adjacent horizontal lines of the image having at least one horizontal line, and containing one or more zones. The zones represent data from one of the image in memory, or of constant pixel values. One or more horizontal description tables are created in the memory, where each table describes the display of one set of adjacent horizontal lines, and has information for displaying the zones across each horizontal line for the set of lines the table corresponds to, and a pointer to the location in second memory of the next table when additional tables are necessary to describe the composite image. Furthermore, when each horizontal description table describing the composite image is read, the pointer in the tables are used to locate other tables in the memory. The image described by the read tables is displayed as directed according to information contained in the table.

The above and other objects of the present invention will become more apparent when taken in conjunction with the following description and drawings wherein like characters indicate like parts and which drawings form a part of the present invention.

BRIEF DESCRIPTION OF THE DRAWINGS

FIG. 2 is the prior art organization of a digital image in a DRAM.

FIG. 4 is a memory map of the DRAM in FIG. 1 in accordance with the present invention for storing a segmented image, where consecutive columns of line segments of the image evenly occupy each DRAM row.

DETAILED DESCRIPTION OF THE INVENTION

Figure 1:
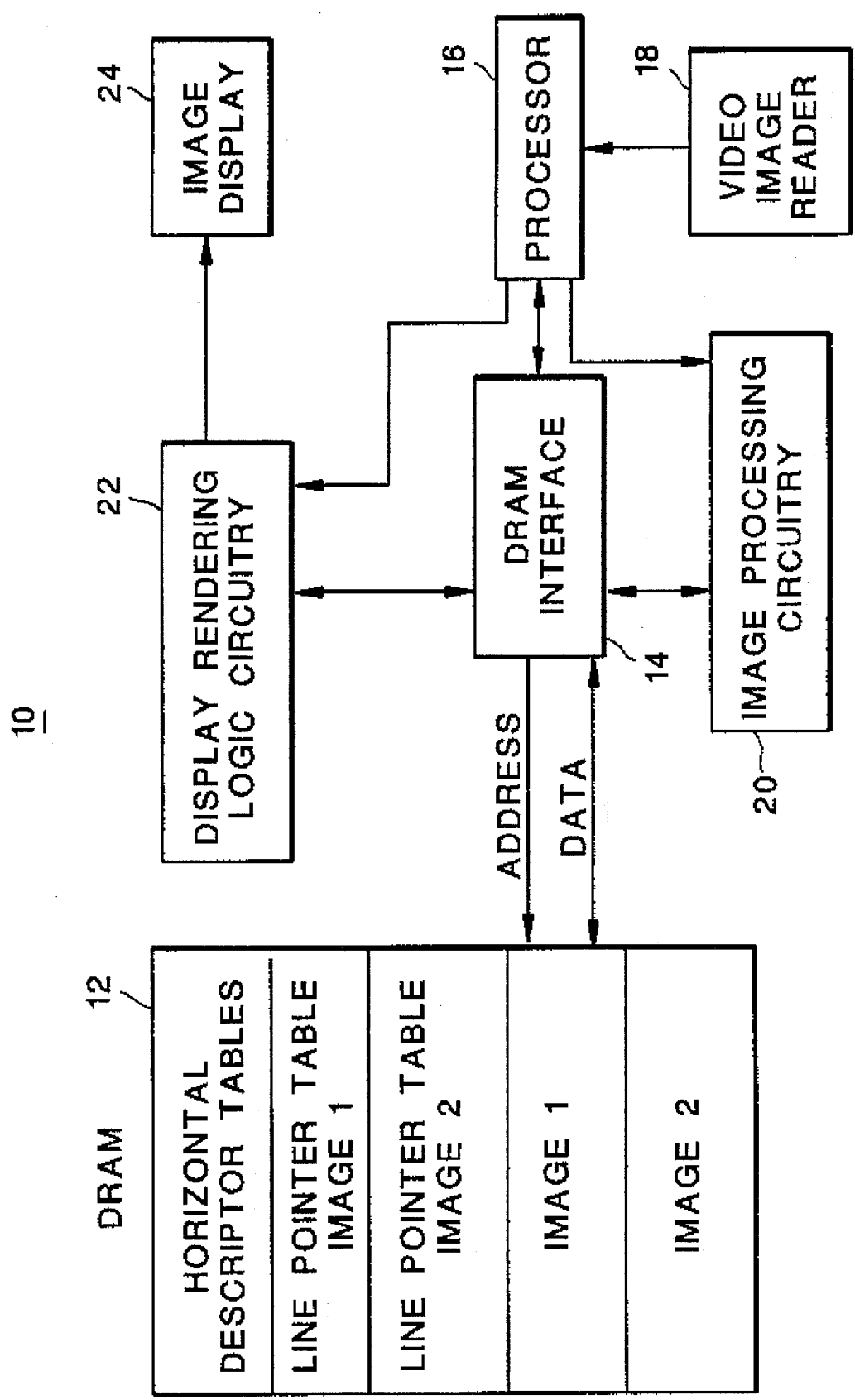
FIG. 1 is a block diagram of a system upon which the present invention may be performed.
Figure 3:
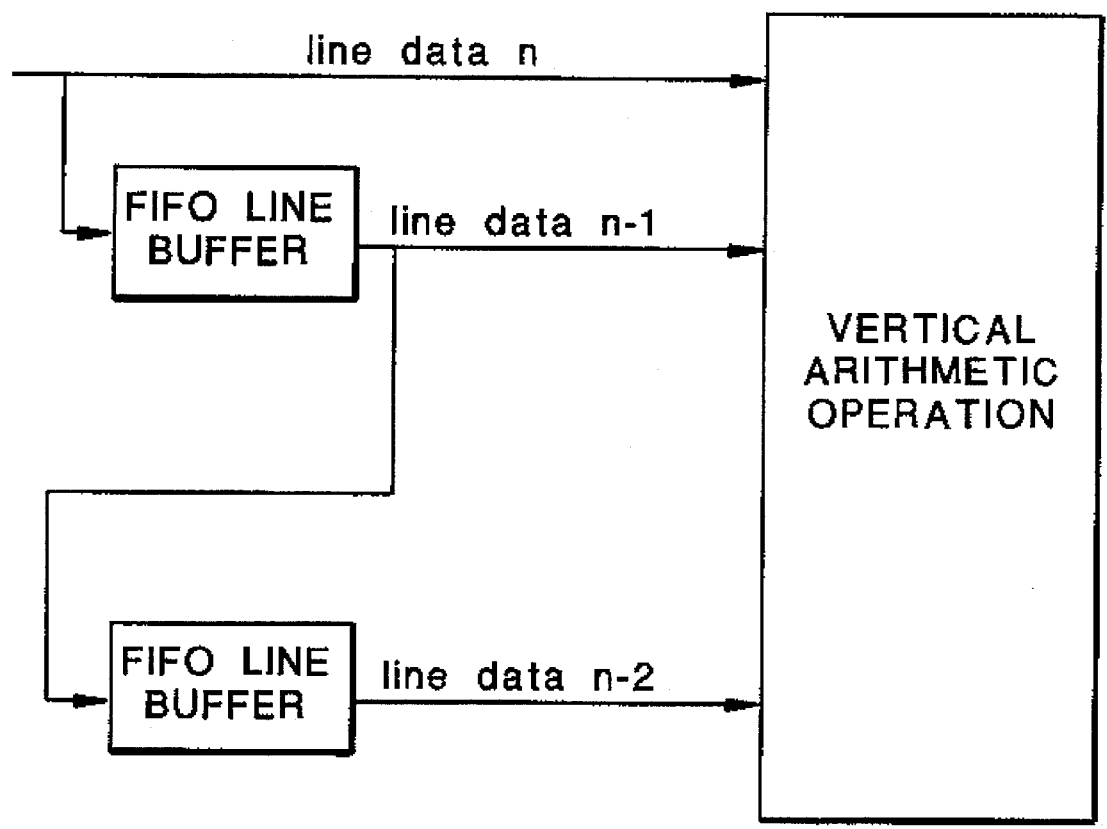
FIG. 3 is a block diagram of the vertical processing step of the prior art for two dimensional processing with prior art DRAM organization of FIG. 2.

FIG. 1 shows a block diagram of a system 10 implementing the present invention. A processor 16 has an operating program for controlling system 10 operation. This operating program may be interfaced with an application program allowing user input and upper level control of the system 10. The processor 16 receives digital video image data from a video image reader 18 connected to the processor 16. The video image reader 18 may be any source providing digital image input, such as a CD-ROM reader (an optical reading device which reads stored digital images from a compact disc). The processor 16 also has built-in random access memory for storing an image read from the video image reader 18.

A standard dynamic random access memory (DRAM) 12 is provided for storing blocks of data referencing segmented memory, line pointer tables (LPT's), and horizontal description tables (HDT's). The DRAM 12 in FIG. 1 represents a memory map tier these blocks having storage of two images. The size of these blocks has been exaggerated for illustrative purposes. The DRAM 12 has addressable memory locations, and may be a bank of several DRAMs or a single DRAM. If a bank of DRAM is used, then a multiplexer circuit (not shown) is added as a stage of the address decoding circuitry of the DRAM 12 for decoding bank bits of the address issued to the DRAM 12 for selecting a particular DRAM. Included in the system 10 is a DRAM interface 14 which contains circuitry for controlling DRAM 12 accesses, and data transfer to and from the DRAM 12. The DRAM interface 14 will be discussed later in detail.

To process a digital video image, the processor 16 organizes and stores the image read from the image reader 18 into the DRAM 12 in a segmented format, herein called segmented memory. The format of the image that has been stored in the built-in memory of the processor 16 has been stored in accordance with the memory map shown in FIG. 2. The processor 16 starts the image organizing and storing procedure by dividing each lines of the digital image into portions called line segments. The size of a line segment is selected so that each line segment contains data for representing an equal number of pixels of a line. For example, a 512 pixel line of an image may be broken up into 16 line segments, each having 64 pixels. Alter segmenting the lines of the image, the image will have vertical columns of line segments from the top to bottom of the image. The number of these vertical columns equals the number of line segments which define each line.

The line segments are then stored in segmented memory of the DRAM 12 according to the memory map of FIG. 4. (The DRAM of FIG. 4 shows line segments evenly occupying DRAM rows, as will be shown this may not always be the case.) "N" represents the number of line segments dividing a line, and hence "Line Segment N" refers to the position of the line segment on a given line of an image. Thus "Line Segment 0" is the first line segment for each line, and "Line Segment N" is the last line segment for each line. "M" represents the number of lines in the image.

Row and column addressing of the DRAM 12 is used in the herein described invention, wherein DRAM 12 memory is divided into block of successive addresses called rows, and within each row the addresses are called columns. In FIG. 4, the line segments which are vertically below one another in a column of the image are stored in consecutive column addresses of the same row address in DRAM 12. Physically in the DRAM 12 this means that within a row address, i.e. a block of addresses, the line segments occupy consecutive groups of column addresses, where each group contains pixel data representing a line segment. As will be shown below, the physical addresses of the DRAM 12 are mapped by the system 10 by logical addresses which are configured to reference each line segment. The order of the line segments in the column addresses of a row is according to their vertical alignment in the image. For instance, the first row (ROW 0) stores "line segment 0 of line 0" (the first line segment in the first line of the image). The next line segment in the first DRAM row stores "line segment 0 of line 1", which is the line segment directly below the first line segment in the second line of the image. Then the next line segment in the same row stores "line segment 0 of line 2", which is the line segment directly below the previous stored line segment in the image. This continues until "line segment 0 of line M" is stored. After the first column of line segments of the image are stored in "ROW 0", a new row is selected (ROW 1) for storing the next column of line segments (line segment 1) in the image from lines 0 to M. This is repeated for each vertical column of line segments across the image at successive row addresses.

By organizing an image in memory this way, multiple line segments can be accessed all under fast page mode accessing with only one DRAM 12 row address cycle. During fast page mode accessing, each line segment can be accessed by a single DRAM 12 row address followed by successive column addresses to obtain data representing each stored line segment in the row. A single row address thereby can provide a series of line segments, or more specifically the pixels they represent, which were once vertically aligned in the image. This facilitates using last page mode accesses for one dimensional image processing of pixel data of a line, and two dimensional image processing where both horizontal and vertical portions of the pixel data are needed. Thus, segmented memory allows an addressing mechanism whereby fast page mode accesses may be employed when both horizontal and vertical image processing operations may occur.

The invention can also process and display multichannel (color) digital images, such as in RGB or YCC formats (3 image channels). A channel herein refers to an image component, where each pixel of an image has separate data for display of each channel. When a multichannel image is segmented as described above, each channel of the image is segmented and mapped to a separate area of DRAM 12.

Segmented memory, as described herein, has a logical to physical address mapping to the DRAM 12 addresses. This mapping is provided in the circuitry of the DRAM interface 14. Mapping is dependent upon the size of a line segment and the type of DRAM 12 devices used. This is because the number of addresses needed to represent a line segment depends on the amount of pixel data in a line segment, i.e. line segment size, and that different DRAM 12 types have different address sizes and data spacing. For mapping to occur in the DRAM interface 14, the bit locations of the logical address are connected to bit locations of column and row address registers. The upper half of the bits in the physical address are then located in the row register and the lower half of the physical address in the column register.

The following guidelines are followed in constructing the logical to physical address mapping in the circuitry of the DRAM interface 14. First, the number of pixels in a line segment is determined (this must be a power of 2). Second, the least significant bits of the logical address are connected to the least significant bits of a column address register, where this number of bits equals the number of bits needed to represent the pixels of a line segment. For example, if a line segment is 64 pixels long, where each pixel has 8 data bits, and a DRAM address has space for 32 bits of data, then 4 bits are needed because 4 pixels occupy each address, and 64 pixels divided by 4 equals 16 or $2^4$. Third, the next most least significant bits of the logical address are connected to the row address register, where this number of bits is equal to the number of bits needed to address a DRAM row (this number depends on the size of the row address for the type of DRAM used in DRAM 12). Fourth, the remaining bits of the logical address, except the bank address bits, are connected to the least significant bits of the column address register adjacent to the bits previously stored in that register. Last, the bank address bits are connected into the least significant bits of the row address register adjacent to the bits previously stored in that register. The bank address bits should be equal to the number of bits need to address each DRAM in a bank. For example, if 4 DRAM's are in the bank, then 2 bits are needed to reference each DRAM (4 equals $2^2$).

Once mapped into the registers, the row and column address may form the physical address issued to the DRAM 12. This may be provided by a second multiplexer in the DRAM interface 14 which outputs the contents of the row and column registers in response to control signals to the second multiplexer. These control signals are referred to RAS (Row Access Strobe) and CAS (Column Access Strobe), and are provided in accordance with how the particular address decoding circuitry of the DRAM 12 is configured to receive an issued address.

FIGS. 9a–9h shows example of the logical to physical address mapping possible for a variety of DRAM devices commercially available. FIGS. 9a, 9b, 9c, and 9d shows addressing of a bank of DRAM 12 for 4 Mb capacity, including 4 DRAM's of 1 Mb, 16 DRAM's of 256 Kb with two CAS cycles, and 16 DRAM's of 256 Kb with two write enable cycles. FIGS. 9e, 9f, 9g, and 9h show addressing of a bank of DRAM 12 for 16 Mb capacity, including 4 DRAM's of 4 Mb, 16 DRAM's of 1 Mb, and 16 DRAM's of 1 Mb with two $\overline{CAS}$. In each example, the line segment size is 64 pixels or 64 bytes, where each pixel corresponds to one byte. As those knowledgeable in the art can appreciate, the particular address mapping depends on the type of DRAM 12, and the size of a line segment. The mapping shown in FIGS. 9a–9h are presented only as examples of implementing logical to physical addresses of DRAM 12.

The present invention also provides for storage of non-segmented lines in DRAM 12 when storing the image in segmented memory is not desired. The DRAM 12 in FIG. 1 shows mapped areas for image 1 and image 2, each area may be either one of segmented or non-segmented memory. Non-segmented memory refers to storage of digital images by processor 16 wherein each line of an image is stored in a DRAM row, and consecutive columns in that row represents a series of adjacent pixels for that line. Non-segmented lines of part or all of a digital image may be stored in DRAM 12. Addressing of segmented lines and non-segmented lines is facilitated by the same fast page mode accessing, only the addressing for processing of the pixel data differs since they are stored in a different order than from segmented memory.

The segmented memory shown in FIG. 4 depicts the line segments for all lines of the image fitting into the number of column addresses of each DRAM row. However, depending on the size of an image, the size and number of the line segments used to described the image, and the size of each DRAM row, a DRAM row will likely be unable to store all the line segments of all the lines of a single vertically aligned column of an image. Consequently, when a row is full because it can no longer store another whole line segment, another row is provided to store the remaining line segments. This row is called an offset row address. If the offset row then become full, another offset row address is provided until the line segment of the last line of a vertically aligned column is stored.

Figure 5:
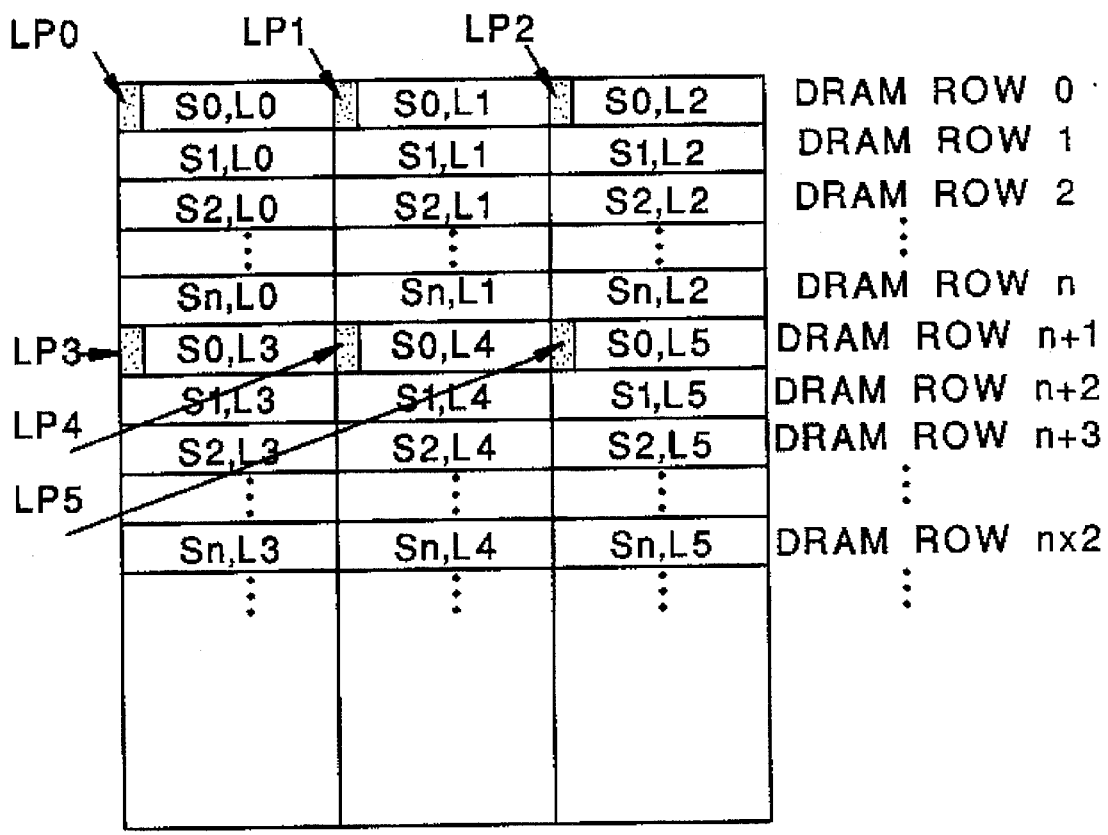
FIG. 5 is an example of a memory map of the DRAM in FIG. 1 in accordance with the present invention for storing a segmented image, where consecutive columns of line segments of the image do not evenly occupy each DRAM row.

FIG. 5 shows an example of a memory map of segmented memory in DRAM 12, where a single DRAM row does not store all the line segments in a vertically aligned column of a segmented image. Each line is divided into Line Segments 0 through n (S0–Sn), where Line Segment n (Sn) is the last line segment in an image line. The line segments are stored in DRAM 12 starting at DRAM ROW 0. Line Segment 0 of image line 0 (S0,L0) is first stored in DRAM ROW 0. Line Segment 0 of image line 1 (S0,L1) is then stored in DRAM ROW 0 where S0,L0 ends. Line Segment 0 of image line 2 (S0,L2) is stored in DRAM ROW 0 where S0,L1 ends. In this example, DRAM 12 is of a type where only three whole line segment can be stored in each DRAM ROW. Therefore, Line Segments 0 from image line 3 "wraps-around" and begins DRAM ROW n+1. Consequently, Line Segment 0 from image lines 3 to 5 (S0,L3; S0,L4; S0,L5) are stored at DRAM ROW n+1. DRAM ROW n+1 is referred to as an offset row, where starting row DRAM ROW 0 is incremented by an offset of n+1. In this manner, each vertically aligned column of line segments is the segmented image is stored at a successive starting row and then at one of more offset rows offset from the starting row, where the first offset row is n+1 from the starting row, and each offset row thereafter is n+1 from the prior offset row. In other words, from each starting row, offset rows (at starting row plus n+1, 2(n+1), 3(n+1) . . . ) will each be occupied until the line segments of a vertical aligned column of the segmented image are stored. This pattern of storing line segments is repeated from each successive starting row (DRAM ROW 0 to DRAM ROW n) for each vertically aligned column of line segments of a segmented image (S0, S1 . . . Sn) until the entire image is stored.

The offset value, n+1, is stored in a register of the DRAM interface 14, which provides the offset value to a counter in the DRAM interface 14 to index the row address issued to the DRAM 12. Thus, each DRAM row may contain a number of line segments that are a fraction of the number of lines in the image. Consequently, during fast page mode accessing of the image each vertical aligned column of an image may be accessed by outputting the line segments in the column addresses of a starting DRAM row, and then one or more offset rows from the starting DRAM row are each fast page mode accessed in the order the line segments were stored.

Due to above organization of line segments, each line of the image may become fragmented over several rows. A means must be provided for to keep track of these memory fragments that arise from segmented memory. This is handled by the part of the present invention in DRAM 12 call line pointer tables (LPT's). FIG. 1 shows DRAM 12 with an LPT memory block for each stored image. An LPT provides the system 10 with the address location of the start of each line of an image stored in DRAM 12. The LPT's are used by the system 10 for displaying and processing images. In the case of single channel (monochrome) images, one LPT is created and stored by processor 16 in DRAM 12 for each image stored.

Each LPT is an area of DRAM 12 having consecutive addresses corresponding to the lines of a stored image. Specifically, each address of the LPT contains an entry providing the address location of the first data representing pixels for a line of an image in DRAM 12, i.e. the location of the start of the stored line. This address location represents at least the starting pixel, but may represent a number of adjacent pixels at the beginning of each image line. For example, an LPT entry can have the address in DRAM 12 providing the location of the first 4 pixels of an image line where each pixel has 8 bits per channel, and a DRAM 12 has 32 bits of data space per address. Thus, the LPT is a list of addresses to the start of each line of an image. For an image stored in segmented memory, the LPT entries provide the logical address of the start of the first line segment of each line. Whereas, for an image stored in non-segmented memory, the LPT entries having the physical address in DRAM 12 of the start of each line. In addition to an address, an indicator is provided in a data field of each LPT entry for indicating whether the line the entry corresponds to is either segmented or non-segmented.

The use of line pointers in segmented memory is demonstrated in FIG. 5. FIG. 5 shows LP0 to LP5, the first five entries of an LPT to segmented memory. This LPT (not shown in FIG. 5) is at some predetermined location in DRAM 12. The DRAM interface 14 may read these line pointers from the LPT in DRAM 12 in order to determine the address of the start of each line. In operation, the multiplexed address mapping of the interface 14 (shown in FIGS. 9a–h) will be provided with the logical address of a line pointer to provide mapping of the logical address to an actual physical address in DRAM 12.

Figure 6A:
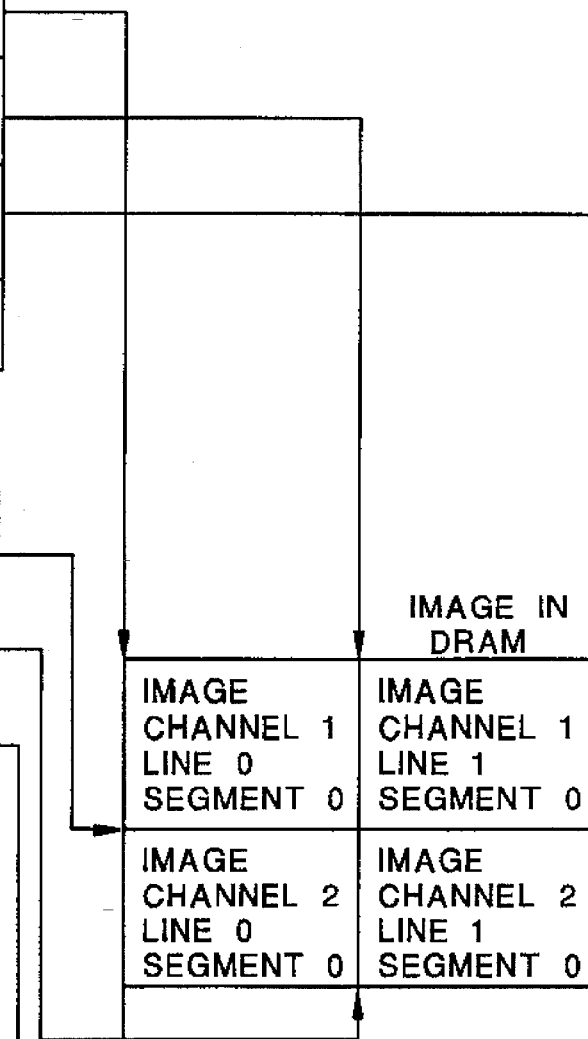
FIG. 6a is an example of a memory map of the DRAM in FIG. 1 in accordance with the present invention showing part of a line pointer table with arrows representing the address locations to segmented memory of a multichanneled image.
Figure 6B:
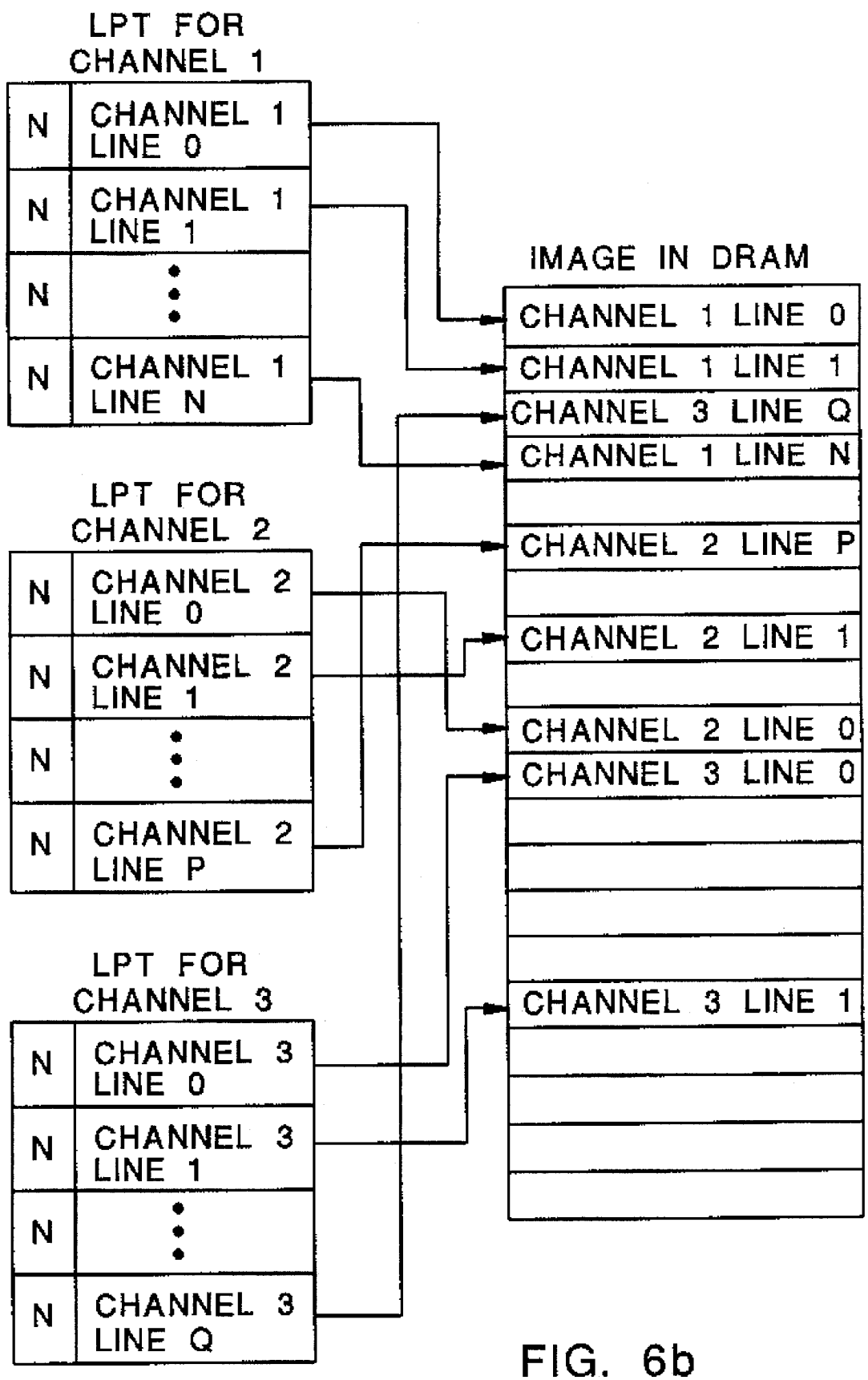
FIG. 6b is an example of a memory map of the DRAM in FIG. 1 in accordance with the present invention showing part of a line pointer table with arrows representing the address locations to non-segmented memory of a multichanneled image.

FIGS. 6a and 6b show examples of LPT's fur multichannel images. A separate LPT is created and stored in DRAM 12 for each channel. FIG. 6a shows an example of LPT's for a three channel image in segmented memory, while FIG. 6b shows LPT's for a three channel image in non-segmented memory. FIGS. 6a and 6b also show a "S" or "N" representing the indicator in the LPT entries. A "S" means that the entry represents a logical address of a segmented line, and a "N" means that the entry represents a physical address of a non-segmented line. A LPT can correspond to lines of either an entire non-segmented or segmented image in DRAM 12, or can correspond to an image stored in parts of either segmented memory or non-segmented memory. As will be shown, an LPT is used by the system 10 in fast page mode accessing from either segmented or non-segmented memory.

One advantage of LPT's is that they alleviate any restrictions of requiring successive lines of an image or image component in non-segmented memory from being stored in successive DRAM 12 rows. See FIG. 6b, where channels and lines of an image are at different rows of DRAM 12. Further, any image component channel can be stored either segmented or non-segmented. The segmented memory organization of the image component channels need not match.

Figure 8:
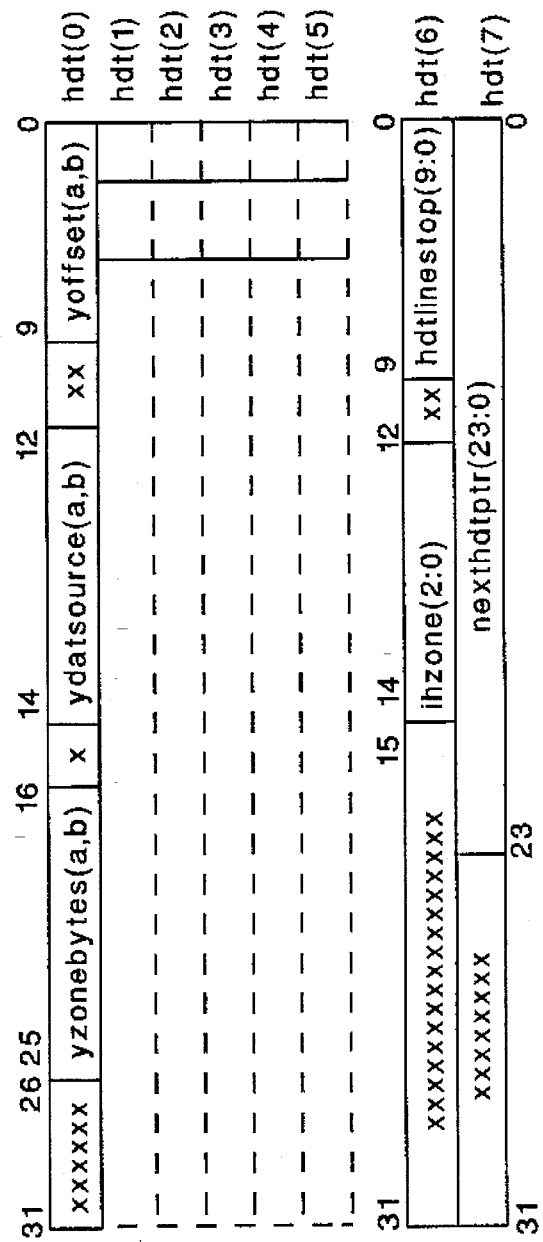
FIG. 8 is a memory map of the DRAM in FIG. 1 in accordance with the present invention for storing a horizontal description table.
Figure 9A:
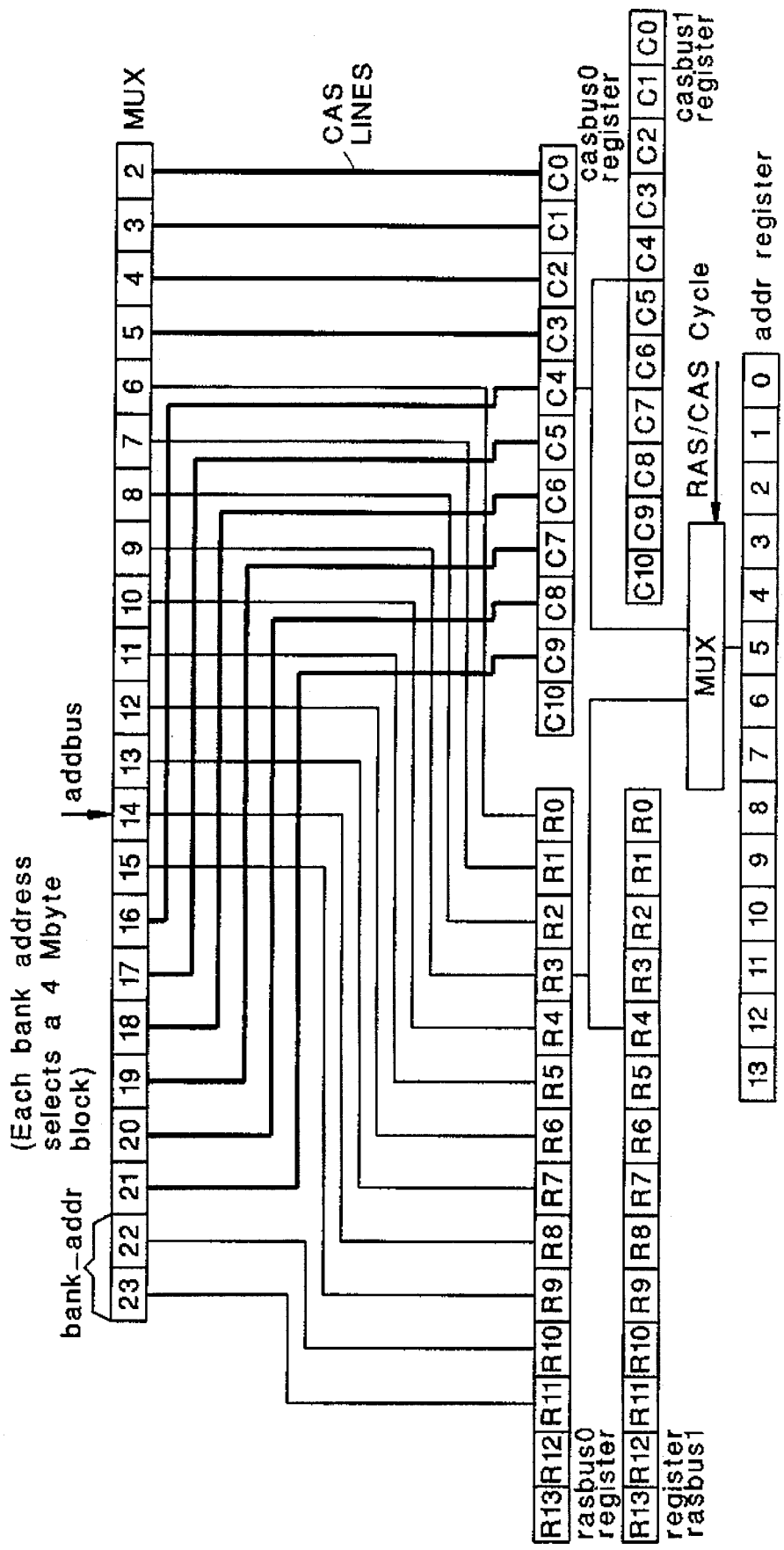
FIG. 9a–h are diagrams of types of mappings of logical addresses into a bank of DRAM for various sizes of DRAM devices.
Figure 9B:
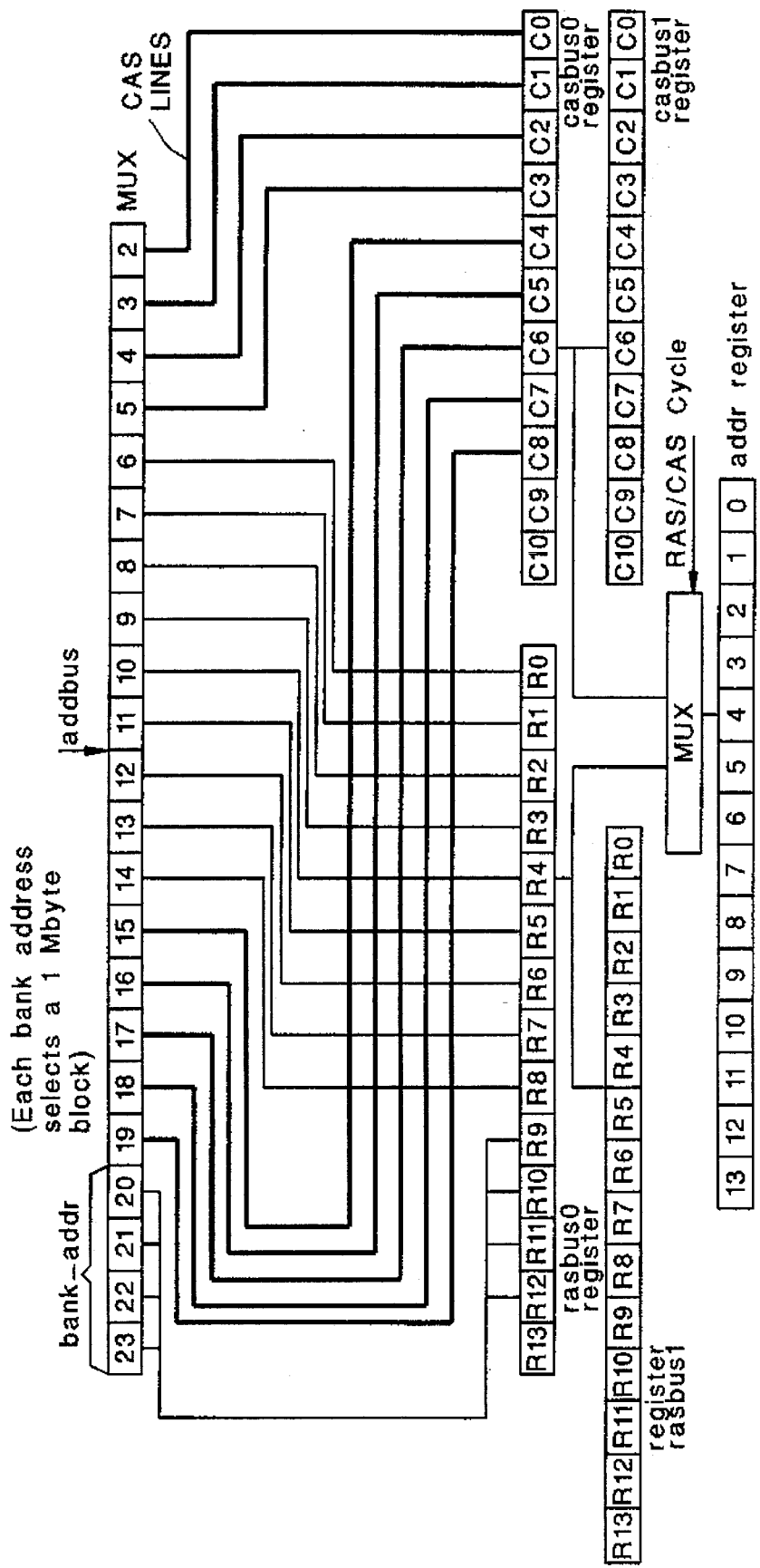
Figure 9C:
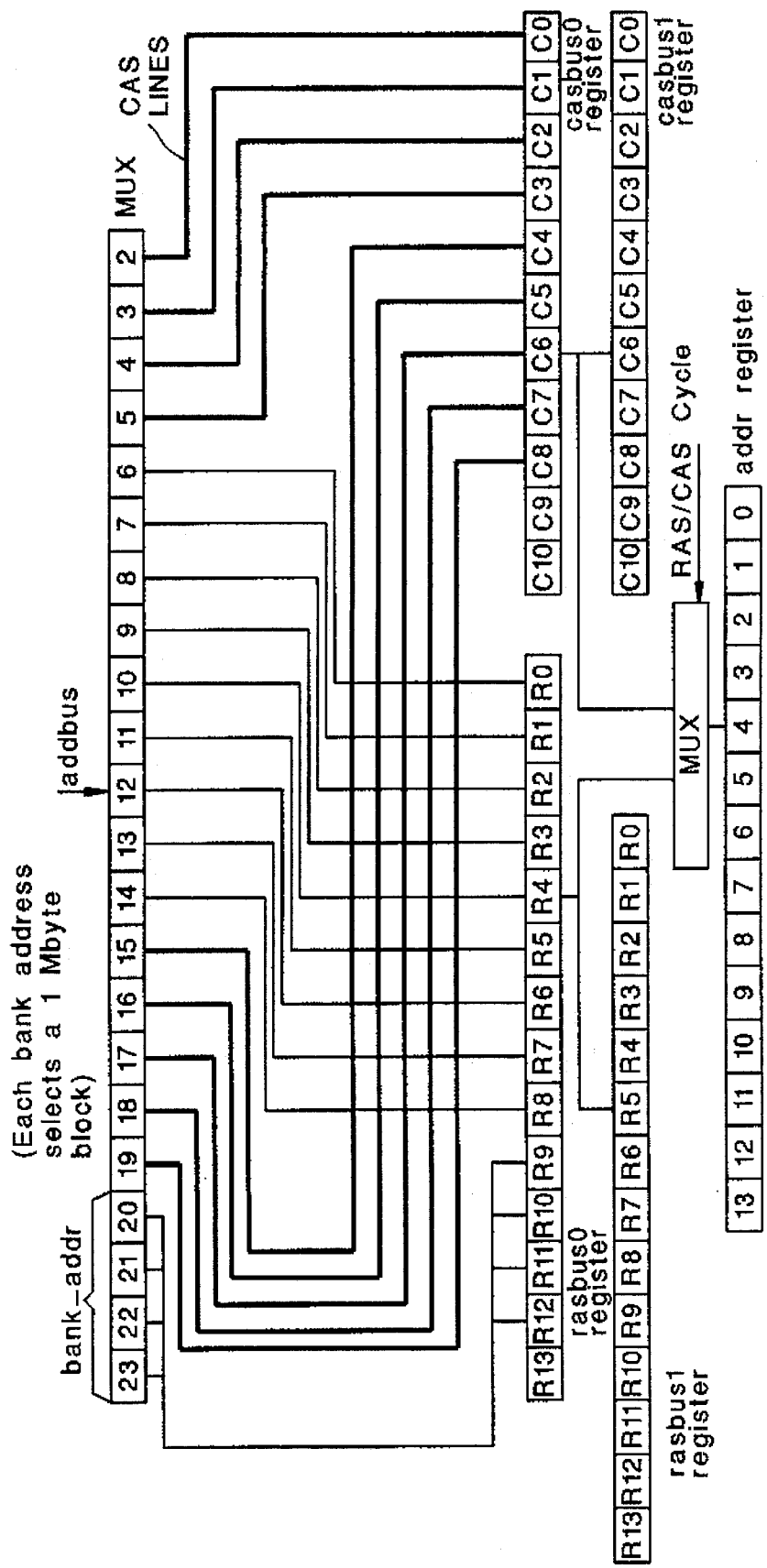
Figure 9D:
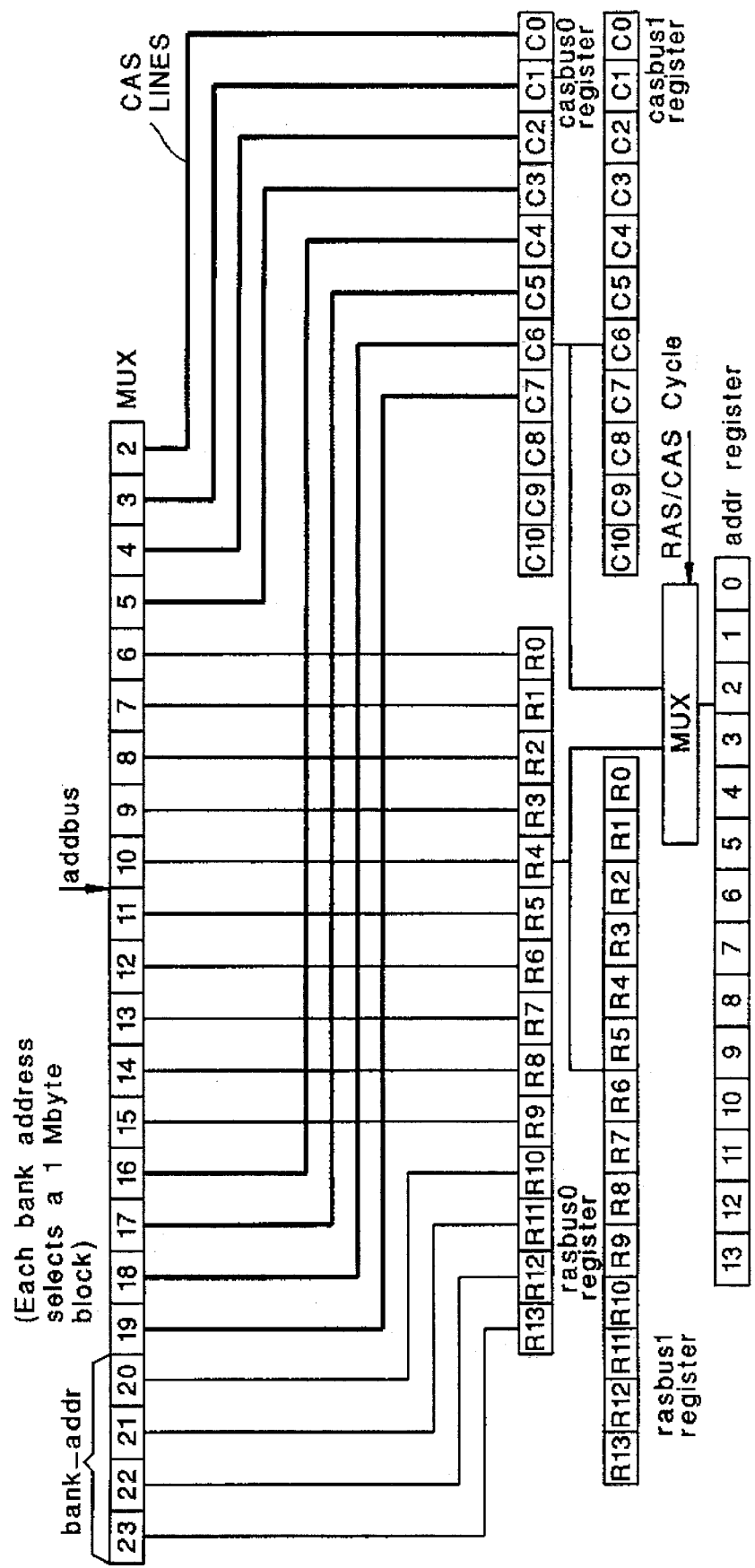
Figure 9E:
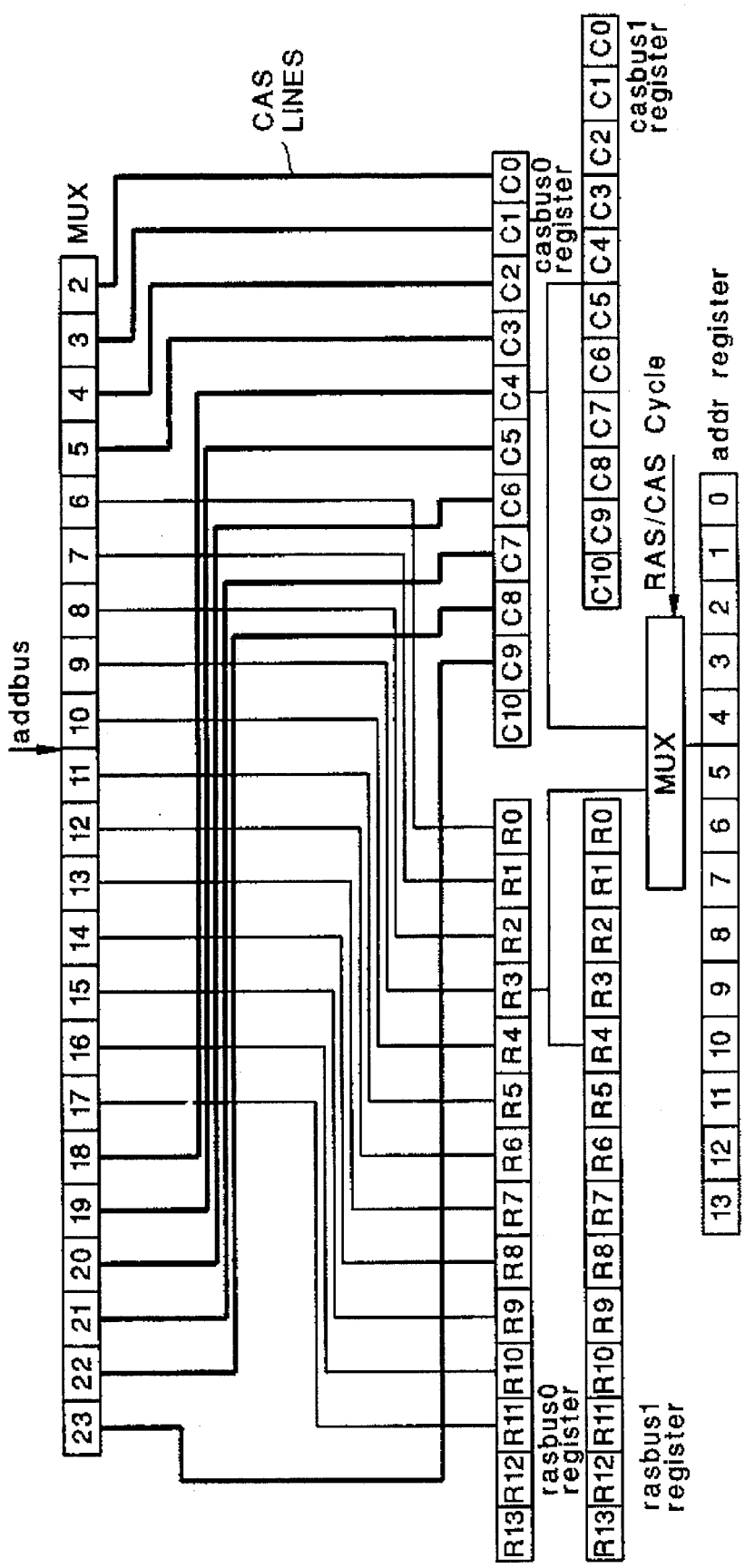
Figure 9F:
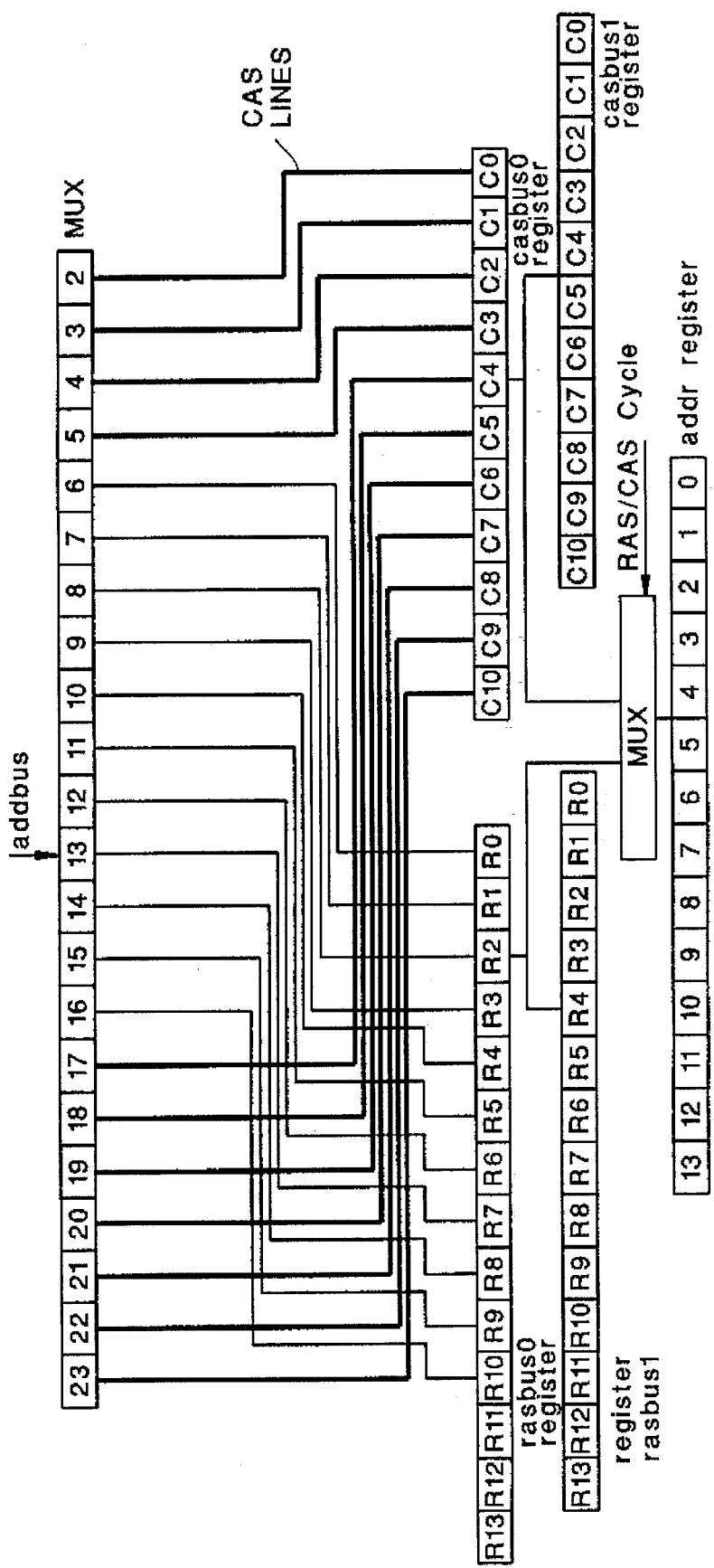
Figure 9G:
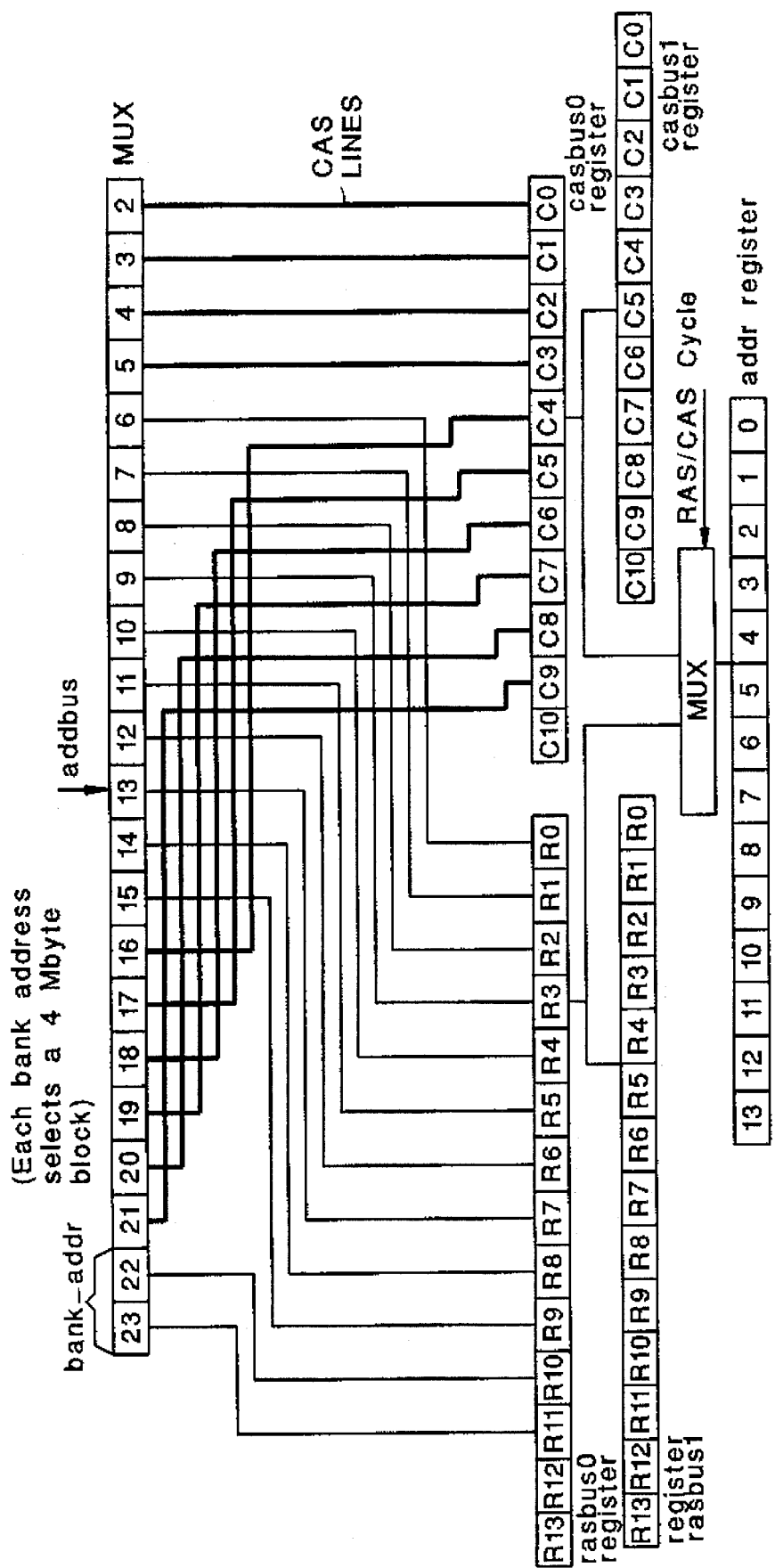
Figure 9H:
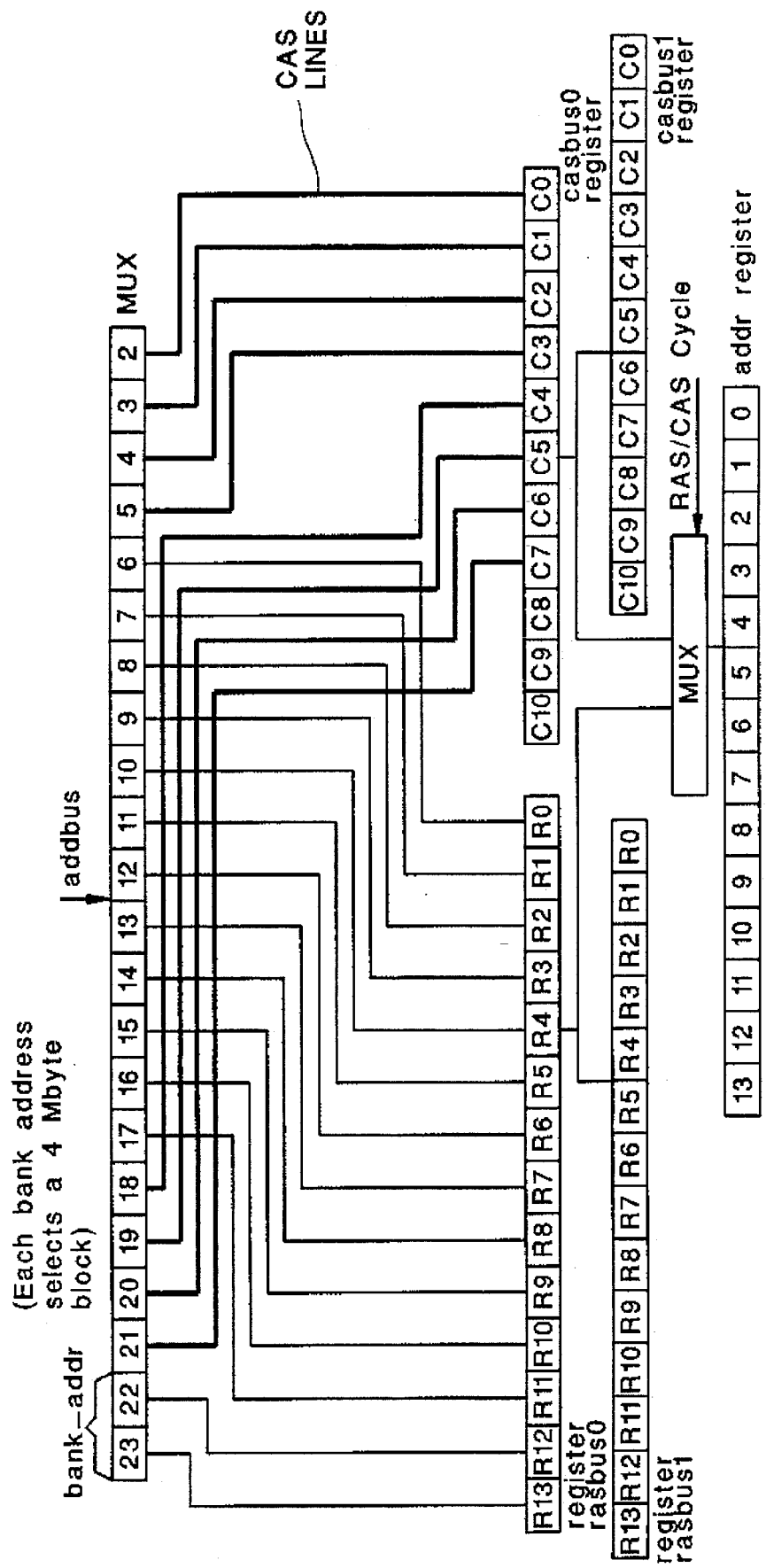

The DRAM 12 of the present invention further stores horizontal description tables (HDT's). FIG. 8 shows an example of the memory map of an HDT in DRAM 12. The HDT's define the display of an image for the display rendering logic circuitry 22. The HDT's are organized and stored in the DRAM 12 by the processor 16. The HDT's may be used to display a composite image formed by portions of multiple images stored in DRAM 12, or a HDT can define a whole image.

Figure 7:
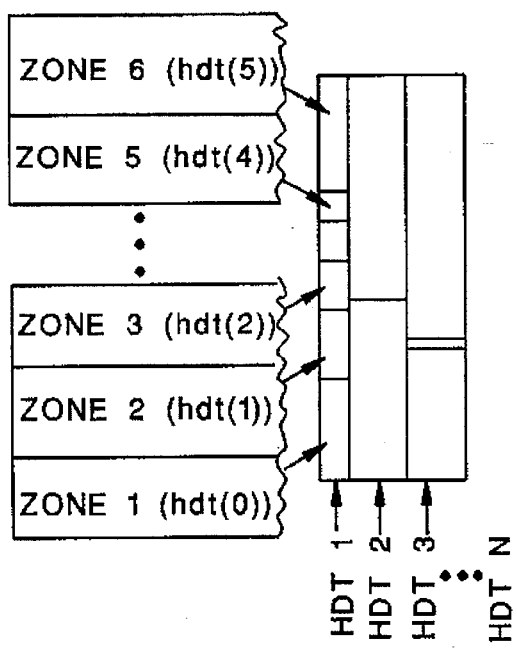
FIG. 7 is an example of a display of a composite video image in accordance with the present invention showing an image divided into zones of pixel regions, and arrows representing the sets of lines to be described by horizontal description tables.

FIG. 7 shows an example of part of a composite image. An image to be displayed is divided into rectangular regions of pixels called zones. The image is then separated into independent sets of adjacent horizontal line having at least one line, and one or more zones. A HDT is provided in DRAM 12 to describe how each set is to be displayed. In the example of FIG. 7, the first HDT (HDT 1) has six zones across the set of lines defining the uppermost lines of the image. The second HDT (HDT 2) has two zones for the set of lines below the uppermost set. If a single HDT does not describe the entire image, as is the case in FIG. 7, additional HDT's are used to describe each set of lines (HDT 1 to HDT N, where N is the number of HDT's defining the image).

FIG. 8 is a diagram of an HDT in the DRAM 12 which has a 32 bit data space for each address. The HDT is stored in consecutive DRAM 12 memory addresses. The data fields of a HDT specify how the pixels of the set the HDT corresponds to are to be displayed. The values in these fields are determined by the processor 16 such that the display rendering logic circuitry 22 will decode the HDT's data fields in determining the pixels for display. For each zone in the HDT, a zone descriptor entry is provided. Each zone descriptor entry has three fields that specify: (1) yzonebyte, the width of the zone in terms of pixels; (2) ydatsource, the source of pixel data for the zone; and (3) yoffset, which specifies where the zone is located relative to the beginning of a line. In the example shown in FIG. 8, hdt(0) to hdt(5) each represent one of six zones of the first HDT (HDT 1) of FIG. 7. Each zone has a zone descriptor entry on a separate successive DRAM 12 address in an order corresponding to where each zone is located on a line. Thus, yoffset would be greater for each successive zone descriptor entry because each entry's yoffset is larger for zones further away from the start of the line.

Ydatsource specifies one of the images stored in DRAM 12, or a background color without any image content. In the example shown in FIG. 8, ydatsource(a,b) represents the case where one of two images in memory exists, image a or image b. When a background color is specified in ydatsource, the zone has pixels of constant values for that color (or tone for monochrome images), instead of image data. Background colors can be specified for a zone where no image content is desired by storing in Ydatsource data referencing a particular background color.

Other fields in an HDT are: Lhzone, which specify the number of zones in the HDT. This also specifies the number of zone descriptor entries in the HDT. Hdtlinestop, which specifies the number of horizontal lines in the HDT. Nexthdtptr, a pointer specifying the address in DRAM 12 of the beginning of the next HDT in memory which defines the next set of lines for the display. If no additional HDT's define the image, then nexthdtptr has a zero value. This nexthdtptr field allows for linking multiple HDT's to form a composite image where each HDT defines the display of a set of lines.

The above format also allows an image to be described by one HDT per line of the display, wherein each HDT addresses the location of the next line via the nexthdtptr field. Also, one HDT can describe all lines of an image. Typically, several HDT's would be needed to describe the display output.

FIG. 1 shows the display rendering logic circuitry 22, which provides pixel data to an image display 24 according to HDT's defining the image to be display. The circuitry 22 instructs the DRAM interface 14 to provide data for an HDT for the display, decodes the HDT data received from the interface 14 as to how each set of lines is to be displayed, instructs the DRAM interface 14 to transfer pixels according to the information decoded, and sends data representing the pixels to the image display 24. The operation of display rendering logic circuitry 22 will be described in more detail later.

A DRAM interface 14 (shown in FIG. 1) is provided to control access and data transfer to and from the DRAM 12. This interface 14 is connected via address and data lines to the DRAM 12, and also is connected to the processor 16, image processing circuitry 20, and display rendering logic circuitry 22. The interface 14 circuity performs arbitration between components accessing the DRAM 12, mapping of logical addresses to physical DRAM 12 addresses, locating addresses in memory to perform DRAM 12 accesses, and fast page mode accessing of the DRAM 12. The interface 14 further includes logic for receiving and decoding instructions sent by other components to the interface 14. Instructions refer to signals the interface 14 responds to for transferring data from the DRAM 12 to a specific component in the system 10, and to storing data received from the processor 16 in DRAM 12 at a specific address location. The interface 14 may have a separate processor, programmed logic array (PLA), or other logic for receiving and decoding instructions, as well as logic for carrying out those instructions. This is similar to an address bus management architecture with additional logic structures. The interface 14 further allows multiple operation to occur at the same time. For example, the interface 14 has the ability to simultaneously allow the display rendering logic 22 to access DRAM 12, and the processor 16 to store an image in DRAM 12.

The DRAM interface 14 locates the logical addresses in memory for stored segmented memory, non-segmented memory, LPT's and HDT's. The interface 14 provides registers, and digital counters for indexing to address locations. These registers include a register for the address of the first entry of each LPT in DRAM 12 (LPT registers), and a register for the address of the first HDT in DRAM 12 for each display of an image (HDT registers). The LPT and HDT registers are set by the processor 16 when each LPT and the first HDT for each image are stored in the DRAM 12.

In a data transfer operation, the interface 14 must locate the first address of the desired part of DRAM 12 to be accessed. This is performed by first using an address stored in an LPT or HDT register. To illustrate this, if an instruction is to transfer data representing the first HDT of an image in DRAM 12 to the display rendering logic circuitry 22, the HDT register of the image to be located is used to obtain the starting address in DRAM 12 at which data is to be accessed. If the instruction is to output a stored image in DRAM 12 to image processing circuitry 20, then the LPT register for that image provides the starting address location of the LPT in DRAM 12 containing the logical address of the image in segmented memory.

The DRAM interface 14 further has a DRAM type register. The DRAM type register contains a value representing the DRAM 12 device being used in system 10. This value is set for system 10 during manufacture, and is updated whenever DRAM 12 type is changed. Further, if the line segment size of the system 10 is not fixed, alternatively, interface 14 will have a line segment size register. The line segment size register would contain a value which corresponds to the length of each line segment in terms of the number of pixels, bytes or bits. The value in the line segment size register may also be set during manufacture, and subsequently updated by the processor 16 operating program or the interface application program.

In fast page accessing of the DRAM 12, the DRAM interface 14 issues the starting address at the beginning of a DRAM 12 row and indexes through the column addresses of that row using a digital counter to update the column address issued. At each fast page mode column access, the data is outputted by the DRAM 12 to the interface 14 where it is routed to a component in the system 10. This fast page accessing of DRAM 12 is used in reading from both segmented and non-segmented memory, however, the addressing scheme differs as will be shown below.

The DRAM interface 14 for fast page mode accessing an image stored in segmented memory, obtains the starting address from the first entry of the LPT associated with the stored image via the logical to physical address mapping in the interface 14. This starting address (row and column) is issued to the DRAM 12 were upon successive column addresses are issued as indexed by a counter in the interface 14. Line segments contained at these column addresses are outputted to the interface 14 on the DATA line.

As stated earlier, segmented memory may be organized in DRAM 12 having a starting row address and then offset row addresses from that starting address to store an entire vertical column of line segments in the segmented image. Consequently, if not all line segments are received by the interface 14 from the starting row, interface 14 indexes the row address issue to DRAM 12 to an offset row address and continues fast page mode accessing. This index to an offset row address is performed by adding to the previous row address issued to DRAM 12 the value in the offset register, which was set to the offset index value when the image was segmented. The interface 14 determines when to index to the next row by calculating the number of whole line segments that can occupy each DRAM row. This is performed by reading the value in the DRAM type register, which indicates to the interface 14 the data spacing of in the DRAM 12 row, and then calculating the number of line segments of that can occupy the DRAM 12 row. If the line segment size is not fixed in the system 10, the interlace 14 will read this size from the line segment size register, and then calculate the number of line segments in a DRAM 12 row. Each offset row is accessed until all the line segments from the starting row and associated offset rows are read. Thereafter, the row address issued to DRAM 12 is indexed to the starting row of the next vertical aligned column of line segments in the segmented image, and fast page mode column accessing continues. Locating the next starting row address in segmented memory by interface 14 is facilitated by the fact that segmented memory is organized at sequential DRAM 12 row addresses. Thus, each starting row address is at a successive row address from the first address of segmented memory provided by the LPT.

When fast page mode accessing an image stored in non-segmented memory, the first entry in an LPT for the image provides the address (row and column) issued to the DRAM 12, thereafter, successive column addresses are issued as indexed by a counter. The address in the LPT entries represents a physical address of the DRAM 12, thus no logical to physical address mapping in interlace 14 is performed. After the pixel data from the entire row (i.e. a line of image data) is outputted on the data line, the next entry in the LPT provides the address (row and column) for the next fast page mode access, and successive column addresses are again issued. This continues until all the row from the image are accessed.

The interface 14 also has logical to physical address mapping as discussed earlier. This address mapping is used when storing and/or reading the image from segmented memory. Alternatively, the logical to physical address mapping to the row and column registers can be performed in software when a separate processor is provided within the interface 14. During non-segmented memory access of the DRAM 12, the logical address mapping in the interface 14 is bypassed, and physical addresses are used by system 10. The interface 14 determines when logical to physical addressing is needed by accessing the indicators in the LPT entries. For example, if an LPT entry has an indicator which refers to a segmented memory format, then the entry contains a logical address and mapping to a physical address will be performed. Whereas, when the indicator in the entry corresponds to a non-segmented memory format, the entry contains a physical address and no mapping is performed.

Image processing circuitry 20 performs the image processing operations on the image stored in segmented memory in the DRAM 12, or more specifically on the pixel data within the line segments. The image processing circuitry 20 is connected to the processor 16, and can receive a signal from the processor 16 to perform a desired image processing operation. The circuitry 22 is set to receive line segments having a size or length which is fixed in system 10. Alternatively, if the size is not fixed, circuitry 22 may be set to receive a line segment size returned to circuitry 22 in response to an instruction to interface 14 to send the contents of the line segment size register. Line segment buffers within the circuitry 20 are configured to receive line segments transferred from the DRAM 12 through the DRAM interface 14. Instead of full line storage buffers, much smaller line segment buffers are used. A line segmented buffer is a fraction of the size of a full line storage buffer. These buffers are cascaded, except to the first buffer, whereby the output of one buffer is the input to the next buffer. The number of these buffers depends on the size of the vertical and horizontal pixel array needed for processing. For example, if three by three processing is to be performed, three buffers would be required to store three adjacent vertical pixels, and at least three adjacent horizontal pixel.

The above described system 10 starts operation by first storing an image in segmented or non-segmented memory in the DRAM 12, and creating an LPT corresponding to the stored image. First, the processor 16 reads and stores an entire digital video image from a video image reader 18 in its built-in memory. Alternatively, the processor 16 may store the image temporarily in non-segmented memory of the DRAM 12. The image is stored in a format where each line represents a row of memory, and consecutive columns represent adjacent pixels. If the image read is multichanneled, each channel of the image is stored in a separate memory area. Once the digital image is stored, the processor 16 determines which lines of the image, or the entire image, is to be segmented or non-segmented. The processor 16 is directed by its operating program, which may be in response to the interfaced application program, as to which image lines will be segmented and non-segmented. However, if two dimensional image processing is desired to be performed, the image must be stored in segmented memory of the DRAM 12.

Before organizing and storing an image in segmented memory, the processor 16 instructs the DRAM interface 14 to return the value stored in the DRAM type register. The processor 16 interprets this value to determine the type of DRAM 12 in the system 10. This information indicates to the processor 16 the proper logical addressing mapping to the DRAM 12 (this corresponds to the logical to physical addressing within DRAM interface 14), the size of each DRAM 12 row, the DRAM 12 capacity, and the size of the row and column addresses of the DRAM 12.

For each line of the image to be segmented, the processor 16 breaks up the line into line segments. The size of a line segment is of a fixed length for the system 10, or alternatively, the size or length of the line segment may be provided by reading the contents of the line segment size register of the interface 14. Based upon this length, the processor 16 can determine the number of line segments which can be placed in a DRAM 12 row. The processor 16 instructs the DRAM interface 14 to store the segments for each vertical aligned column of the segmented portion of the image into the DRAM 12 in one or more consecutive logical address rows, per the procedure described earlier in reference to FIGS. 4 and 5. The processor 16 instructs the DRAM interface 14 as to the logical address to store each line segment, wherein the interface 14 maps that address into a physical DRAM 12 address.

For any non-segmented line of the image, the processor 16 stores these lines in non-segmented memory in the DRAM 12 through the DRAM interface 14, wherein a line is stored at a row address at successive column addresses in that row referencing adjacent pixels of the line. The processor 16 provides the physical addresses (row and column) for storing each line of pixel data. The logical to physical address mapping in interface 14 is bypassed during this operation.

As the image is stored, in either segmented or non-segmented format, the processor 16 builds an LPT for the image. As earlier described, for each line of the image, the processor 16 creates an entry in the LPT containing the address to the first data representing pixels of each line of the image, and sets an indicator in a data field of the entry indicating whether the line was segmented or non-segmented. The entry address is a logical address for a segmented line, and a physical address of the DRAM 12 for a non-segmented line. The processor 16 instructs the DRAM interface 14 to store the LPT entries at consecutive addresses in the DRAM 12. An LPT register in the DRAM interface 14 is set to the starting address of the LPT to facilitate locating the LPT in DRAM 12.

The system 10 creates an HDT, or a series of linked HDT's, to describe the display of an image. The processor 16 is programmed to accept display information. This display information may be read from one of several sources. One source may be the video image reader 18. The video image reader 18 could provide a play list defining how read images are to be displayed. A second source may be in the processor 16 operating program. Further, a third source may be the an interfaced application program, wherein a user can define a particular display.

According to the display information, the HDT's are stored by the processor 16 as already described (See FIGS. 7 and 8). To reiterate, the processor 16 divides the image into zone of rectangular pixel regions. Each zone has an identifiable start line and end line, and has an image source from one of the image stored in memory or a background color. Starting at the top of the image, the lines are separated in sets of lines having one or more zones. Each set is defined by an HDT. In creating the HDT, zone descriptor entries are added for each zone, starting left to right. Next, other data fields are also added to describe the number of zones in the HDT, and number of lines in the zone. The last field in the HDT, nexthdtptr, is a pointer to the address of the next HDT of the image if another HDT exists, otherwise this field equals zero. The processor 16 instructs the DRAM interface 14 to store each HDT for the image at consecutive addresses in DRAM 12. A HDT register in the DRAM interface 14 is set by the processor 16 to the starting address location in DRAM 12 of the first HDT describing the image.

The system 10 performs one or two dimensional image processing of stored images using the image processing circuitry 20. Image processing is initiated in response to a signal from the processor 16 to perform image processing on a particular image in segmented memory. The image processing circuitry 20 instructs the DRAM interface 14 to transfer the image data, i.e. line segments, from segmented memory of the DRAM 12 using the fast page mode accessing discussed above. While the line segments are received by the image processing circuitry 20, each are temporally stored and shifted between the cascaded line segment buffers. Between each shift, the pixel data within each buffer is read and manipulated by the circuitry 20 to provide processed line segments. The processed line segments are stored back into the DRAM 12 in the same order as received, and in the same DRAM 12 addresses at which they were read. In this way, a new LPT need not be generated for the processed image. The interface 14 controls the storage of processed line segments to the DRAM 12, while line segments are being transferred to the image processing circuitry 20.

Alternatively, the interface 14 may fast page mode access any subset number of line segments in a DRAM 12 row. This can be achieved by using one or more counters in the interface 14 to index addresses for the desired line segments in a row using the fast page mode accessing described earlier. The image processing circuitry 20 may also alternatively receive and store in a FIFO buffer each of the accessed subset of line segments. These buffers are not cascaded. Once stored, the data in these buffers is processed, and outputted as stated above. Then, the next DRAM 12 row is fast page mode accessed to provide the same number of line segments and at the same column addresses of the prior read row. For example, in FIG. 5 a subset of two Line Segments, S0,L0 and S0,L1, may be first read and processed, and then S1,L0, and S1,L1 may be read and processed. The number of line segments in a subset may be any number of adjacently stored line segments in a DRAM row, and may even "wrap around" to corresponding offset rows. As each subset of line segments from a DRAM 12 row are stored in the buffers, image processing is performed on their pixel data. The above is repeated for each corresponding subset of line segments from each DRAM row. The procedure is then performed on the next subset of line segments which are stored in each DRAM row after the prior read subset of line segments. Processing of the line segments in segmented memory continues in this manner until processing of the image is completed.

Images to be displayed by system 10 are stored in DRAM 12 in non-segmented memory. Thus, any images stored in segmented memory must first be reformatted into non-segmented memory by processor 16 before being displayed. This is achieved by reversing the image segmenting process described earlier. This reverse segmenting process utilizes the LPT for the image stored in DRAM 12 to locate each line segment. The procedure for building each successive line of the image in non-segmented memory is as follows: Using the address in an entry of the LPT corresponding to the line of the image to be built as a starting point, the first line segment of the line is read (fast page mode accessed). Based on that same address, each subsequent line segment in the line is read at a successive row address across the same set of column addresses as the first line segment. For example, the first line of the segmented image in FIG. 5 starts with S0,L0 (LP0 points to the first data representing pixels of S0,L0) and S1,L0 to Sn,L0 are stored at successive rows underneath S0,L0 at the same column addresses as S0,L0. In this manner, all the line segments are read and assembled into the line of the non-segmented image. The line is then stored into non-segmented memory of DRAM 12 by processor 16. Then, in a new LPT, a LPT entry for the non-segmented memory is set to the address having the first data which start the line. The above is repeated until each successive line of the image is stored in DRAM 12 non-segmented memory, and a corresponding LPT is generated. If future image processing of the image in segmented memory is not required, the rows of non-segmented memory of the image may replace the image in segmented memory once reverse segmenting is completed, otherwise, the non-segmented memory of the image is stored in another area of DRAM 12.

For display of an image, the processor 16 signals the display rendering logic circuitry 22 to output a particular display. The display rendering circuitry 22 instructs the DRAM interface 14 to output the first HDT for the desired display image. The first HDT of the image display is read in after vertical synchronization of the image display 24. Vertical synchronization occurs during the interval during the scanning by the image display 24 when the scanning switches from the bottom line to the top line of the display. Subsequent HDT's for the composite display are loaded into the display rendering logic circuitry 22 after the video horizontal synchronization of the image display 24 that occurs after the extent of each previous HDT (in terms of number of lines) is exhausted. Horizontal synchronization occurs during the interval when the scanning of the image display 24 switches from the end of one line to the start of the next line. The image display 24 includes the necessary raster circuits which respond to control signals (vertical and horizontal synchronization) sent by the display rendering logic circuitry 22 with the pixel data to the image display 24.

After each HDT is read, it is decoded by the circuitry 22 as to how a set of lines are to be displayed, and then instructs the interface 14 to output the desired pixel data. The decoding operation is as follows: The circuitry 22 determines from the read HDT the number of zone descriptor entries or zone from the lhzone data field. The circuitry 22 then cycles through the zone descriptor entries for each line to be displayed until the last line reaches the value in the hdtlinestop data field. During each cycle, each zone descriptor entry in read. This reading includes determining the source data or background color from the ydatsource field, the number of pixels to be displayed from the yzonebyte field, and the location from the start of the line where the pixels are to be displayed from the yoffset field. For each zone descriptor entry not specifying a background color, the circuity 22 instructs the DRAM interface 14 to retrieve the particular pixel data for the zone the entry describes. When a zone descriptor entry references a background color, the circuitry 22 generates the pixel data of that color for the zone the entry describes. After receiving or generating the pixel data for each cycle through the zone descriptor entries, the circuity 22 organizes the pixel data for each zone into a data signal for a complete image line, which includes the vertical and horizontal synchronization information described above. The data signal is sent to the image display 24 for displaying. Once the last line is reached (hdtlinestop), the circuitry 22 instructs the interface 14 to obtain the next HDT during horizontal synchronization of the image if the nexthdtptr field contains the starting address of an HDT.

In operation, the instruction to the DRAM interface 14 from the circuitry 22 to retrieve the particular pixel data specifies the particular image in non-segmented memory of DRAM 12 (ydatsource), the specific line of the image to be displayed, and the location on that line corresponding to the start of the zone (yoffset) for a number of pixels in that zone (yzonebyte). The interface 14 in response to the instruction reads an entry in the LPT for the stored image requested to provide the address of the first data for pixels of the line to be displayed. (Since the LPT is a list of address locations of the start of each successive line, the LPT may be indexed to an entry referencing the line of the stored image corresponding to the line to be displayed.) Fast page mode accessing then occurs at the row address of the LPT entry starting at the column address in that row of the pixel data starting the zone, and extending for the number of pixels in the zone, as specified in the instruction. The pixel data accessed is then sent by the interface 14 to the circuitry 22.

By using HDT's, the system 10 has a means for displaying an image that is a composite of pieces of different images. The composite image is never actually formed in a DRAM 12 display area. Examples of composite images include performing various digital video special display effects that require composing pieces of more than one image, such as blinds, curtains, wipes and blocks. The HDT's can also be dynamically updated in the DRAM 12 by the processor 16 during display, such that each time the display rendering logic circuitry 22 reads in HDT's, they can represent an updated composite image display.

In the system 10 of the present invention the speed of image processing is a consideration. Most real world sources of image (such as digitizing scanner) preserve the sequential line scan (raster scan) row by row image data format. (See FIG. 2) A reformatting of the data must occur to convert most digital image data sources to the segmented memory arrangement, which is a relatively slow procedure. It can therefore be reasoned that a segmented memory arrangement would work well in a system 10 where: (1) the time to read the image into memory can be slow, (2) memory accesses of the image data in DRAM 12 must be as fast as possible, particularly for two dimensional processing, (3) the image data arrangement for reading out the image is not critical. This is precisely the situation when the video image reader 18 is a CD-ROM reader. The read rate of the CD-ROM is much slower than the data processing rates required for real-time video processing.

The system 10 may be incorporated into an Application Specific Integrated Circuit Chip (ASIC), however in the alternative, separate components could be combined to build the system 10.

Use of the present invention in image processing offers many advantages over conventional image processing. Segmented memory allows for fast page mode DRAM accesses to occur, even when two dimensional image processing operations are involved. This engenders a system performance advantage. There is no need for full line length storage buffers to accomplish two dimensional image processing operations. Instead segmented memory allows two dimensional operations to be processed using much smaller line segment butters. This is extremely important and useful in an apparatus constructed from a digital integrated circuit. Although great advances have been made in VLSI circuit design, large amounts of Static Random Access Memory (SRAM) consume a great deal of integrated circuit real estate and power. This is especially true in a semi-custom integrated circuit. Significant savings in SRAM is accomplished through use of smaller line segment buffers.

Line pointer tables provide a means to locate each line of an image in system 10. This is needed to account for the fragmentation that can occur to an image when stored in segmented memory. The line pointer tables also provide a means by which lines of an image can be stored on a non-contiguous basis. The line pointer tables also provide a means to locate lines of an image stored in a non-segmented image memory organization. Therefore the line pointer tables are compatible with and can be used with images stored in non-segmented memory, as well as segmented memory. This allows for mixing image memory organizations for multiple images and various components of multichannel color images. The line pointer tables when used in conjunction with horizontal description tables, provide a means to locate the pieces of multiple images required to form a display composite.

Horizontal description tables provide a means to display an image that is a composite of pieces of different images. The method of using HDT's allows the composite to be dynamically formed by the display 24. The composite image is never actually formed in the display area of memory. This saves the time of physically performing memory reads of each of the image areas needed for the composite, and writing them into a memory display area to form the composite image. This provides a system performance advantage in performing various digital video special display effects, that require compositing pieces of more than one image.

While there has been shown what is considered to be the preferred embodiment of the invention, it will be manifest that many changes and modifications may be made therein without departing from the essential spirit of the invention. It is intended, therefore, in the annexed claims, to cover all such changes and modifications as may fall within the true scope of the invention.

Parts List:

10. The System of FIG. 1.
12. DRAM
14. DRAM Interface
16. Processor
18. Video Image Reader
20. Image Processing Circuitry
22. Display Rendering Logic Circuitry
24. Image Display

We claim:

1. A method for organizing and addressing a memory storing data representing a digital multichannel image having successive lines of pixel elements of said image, said method comprising the steps of:

storing in a first memory said digital image corresponding to said data representing said successive lines of said pixel elements for each said image channel;

selecting said lines of said image to be segmented for each said image channel;

segmenting each said selected segmented line for each said channel of said image stored in said first memory into line segments, wherein each said line segment represents an equal number of said pixels, and said image channel has consecutive columns of line segments;

selecting for each channel said line segments of one said column in successive order;

storing for each channel in a second memory said selected line segments in said successive order in one or more rows of said second memory; and storing for each channel each line not selected to be segmented into one of said rows of said second memory according to the order of said pixels on said line not selected.

2. A method according to claim 1 further comprising the step of creating for each said channel a line pointer table in said second memory having information representing the locations of the start of each line of said image in said second memory, and indicators representing whether each line of said image was segmented.

3. A method according to claim 2 further comprising reading each image channel stored in said second memory using fast page mode accessing.

4. A method according to claim 3 where said reading further comprises reading said indicator in said line pointer table for one of said image channels to determine whether one of said lines of said image channel is segmented, and where said line is segmented, reading said line pointer table to determine the location in said second memory of the start of the first said line segment in one of said segmented lines of said image channel, selecting said read location of said second memory, and reading said data representing said pixels of said line segments starting from said selected location of said second memory, and where said line is not segmented, reading said line pointer table to determine the location in said second memory of the start of one of said lines of said image channel, selecting said read location from said second memory, and reading from said selected location said data representing said pixels through the row corresponding to said selected location.

5. A method for displaying a digital image composed of a two dimensional array of pixel elements having representative display values, using a digital processor and memory accessible by said digital processor, where said memory stores data representing successive horizontal lines of said pixel elements for one or more digital images, said method comprising the steps of:

(a) horizontally dividing said digital image into rectangular zones of pixel regions, wherein said zones represent data from one of said digital images in memory, and of constant pixel values;

(b) separating said digital image into sets of adjacent said horizontal lines having at least one said horizontal line, and one or more said zones; and (c) creating one or more horizontal description tables in said memory, one or more of said horizontal description tables describing the display of one said set of horizontal lines, and having information for displaying said zones across said horizontal line for said set said horizontal description table corresponds, and a pointer, pointing to the location in said memory of the next said horizontal description table when additional said horizontal description tables describe said image.

6. A method according to claim 5 further comprising the steps of:

(d) reading each said horizontal description table describing said display, where said pointer in said horizontal description tables is used to locate other said horizontal description tables in said memory; and (e) displaying said digital image described by each said read horizontal description table according to information contained therein.

7. A method according to claim 6 wherein each said horizontal description table has entries comprising:

one zone entry for each zone crossing horizontally the set of lines which said horizontal description table describes, each said zone entry comprising; a first data field defining the number of pixels in said zone, a second data field defining an offset number of pixels relative to the first pixel of said horizontal lines said horizontal description table describes, and a third data field defining a source of said pixel data for said zone as one of said digital images in memory and of constant pixel values; and other said entries having a fourth data field defining the number of zones in said horizontal description table, a fifth data field defining said lowermost line of said set described by said horizontal description table, and a sixth data field defining said pointer to the location in said memory.

8. A method according to claim 7 where said displaying step for each said read horizontal description table is further comprised of the steps of:

determining the number of zone entries corresponding to said fourth data field from said read horizontal description table;

cycling said processor through said zone entries of said read horizontal description table, each said cycle extending for said determined number of zone entries, until the last line displayed corresponds to said fifth data field of said read horizontal description table; and displaying said pixels during said cycling from each said zone entry of said read horizontal description table by reading said pixel data from said source corresponding to said third data field in said zone entry of said read horizontal description table, from the offset corresponding to said second data field in said zone entry of said read horizontal description table relative to the first pixel of said horizontal line being displayed, for the number of pixels corresponding to said first data field in said zone entry of said read horizontal description table.

9. A method according to claim 6 wherein said displaying of said digital image includes:

displaying said digital image onto a display having a top and bottom line, and each line of said display having start and end points;

scanning pixel elements onto said display according to consecutive horizontal lines of said digital image, where after scanning said bottom line said scanning switches to said top line to continue said scanning, wherein said switch from said bottom line to said top line defines a first temporal interval;

said scanning of said horizontal line further includes at the end of said line switching to said start of the next said line, wherein said switch from said end of said line to the start of said next line defines a second temporal interval; and said reading of said horizontal description tables occurs during one of said first and second intervals.

10. A method according to claim 5 further comprising the steps of:

storing in said memory for each digital image stored in said memory a line pointer table having entries referencing the location in said memory of the start of each successive line in said stored digital image;

reading each said horizontal description table describing said display, where said pointer in said horizontal description tables is used to locate other said horizontal description tables in said memory; and displaying said digital image described by each said read horizontal description table according to information contained therein, wherein said pixel data of said zones of said read horizontal description table is located in said memory utilizing said line pointer table to reference the location of one of said lines of said stored digital image having data corresponding to said zones in said read horizontal description table.

11. A method according to claim 10 wherein each said horizontal description table has entries comprising one zone entry for each zone crossing horizontally the set of lines which said horizontal description table describes, each said zone entry comprising a first data field defining the number of pixels in said zone, a second data field defining an offset number of pixels relative to the first pixel of said horizontal lines said horizontal description table describes, and a third data field defining a source of said pixel data for said zone as one of said digital images in memory and of constant pixel values, and other said entries having a fourth data field defining the number of zones in said horizontal description table, a fifth data field defining said lowermost line of said set described by said horizontal description table, and a sixth data field defining said pointer in said horizontal description table.

12. A method according to claim 11 where said displaying step for each said read horizontal description table further comprises:

determining the number of zone entries corresponding to said fourth data field from said read horizontal description table;

cycling said processor through said zone entries of said read horizontal description table, each said cycle extending for said determined number of zone entries, until the last line displayed corresponds to said fifth data field of said read horizontal description table; and displaying said pixels during said cycling through each said zone entry of said read horizontal description table by reading said line pointer table entry corresponding to the line of the image to be displayed of the digital image in said memory corresponding to said third data field in said zone entry of said read horizontal description table, selecting said location in said memory provided by said read line pointer table entry, reading said pixel data at an offset from said selected location according to said second data field in said zone entry of said read horizontal description table relative to the first pixel of the line being displayed, for the number of pixels corresponding to said first data field in said zone entry of said read horizontal description table.

13. A system for displaying composite digital images of pixel elements having representative display values comprising:

a memory storing one or more digital images and one or more horizontal description tables;

each of said horizontal description tables containing data describing the display of a set of horizontal lines in said composite digital image according to one or more zones of pixel regions which divide said set of horizontal lines, wherein each of said zones represents data from one of said digital images in memory and constant pixel values; and display means for reading said stored horizontal description tables from said memory, decoding said read horizontal description tables to provide a description of the display of the zones in the set of horizontal lines said horizontal description table describes, reading said memory to provide pixel data corresponding to said zones of said read horizontal description table from one of said digital images in memory, generating said pixel data corresponding to said zones of said read horizontal description table representing data of constant pixel values, and displaying said read and said generated pixel data.

14. A method for organizing and addressing a memory that stores data representing a digital image having successive lines of pixel elements of said digital image, said method comprising the steps of:

storing in a first memory said digital image corresponding to said data representing said successive lines of said pixel elements;

segmenting each line of said digital image stored in said first memory into line segments, wherein each said line segment represents an equal number of said pixels, and said digital image has consecutive columns of said line segments;

selecting said line segments of one said column in successive order, and storing in a second memory said selected line segments in said successive order in one or more rows of said second memory;

creating a line pointer table in said second memory having data representing the location in said second memory of the first said line segment for each said segmented line of said image; and reading said line segments from said second memory using fast page mode accessing by reading said line pointer table to determine the location in said second memory of the first line segment in one of said segmented lines of said image, selecting said read location of said second memory, and reading said data representing said pixels of said line segments starting from said selected location of said second memory.

15. A method according to claim 14 further comprising:

image processing said stored line segments to produce processed pixel data in processed line segments; and storing said processed line segments in said successive order in one or more rows of said second memory.

16. A method according to claim 15 further comprising reading pixel data of said processed line segments from said second memory, storing the pixel data of said read processed line segments into successive lines of an image in said second memory, reading one of said successive lines of said image having said stored pixel data corresponding to said processed line segments, and outputting onto a display said read line of pixel data.

17. A method according to claim 14 further comprising the steps of:

storing said read line segment into one of a plurality of data buffers;

performing image processing on data representing said pixels of said line segments stored in at least one of said buffers to produce processed pixel data in processed line segments; and storing said processed line segments into said second memory corresponding to said successive order in the same said rows of said second memory which stored said selected line segments.

18. A method according to claim 14 wherein said rows of said second memory include offset rows, each offset row storing said line segments when one said row is substantially full and can no longer store another whole said line segment.

19. A method according to claim 14 where said storing of said line segments further comprised:

mapping said line segments into said rows of said second memory at consecutive columns in each said row, where said second memory is a bank of one of more DRAMs, said DRAM in said bank being one of a plurality of memory sizes; wherein, said rows and said columns of said second memory correspond to logical addresses for said storing of said selected line segments, and each said logical address is represented by a series of bits, said mapping comprising:

determining the number of said bits of said logical address needed to represent the number of pixels in each said line segment;

storing said determined bits needed to represent each said line segment into the least significant bit locations of a column address register;

determining the number of bits of said logical address needed to address a row of said DRAM, where this number corresponds to said DRAM memory size;

storing said determined bits needed to address a row of said DRAM into a row address register;

determining the number of bits of said logical address needed to reference said column of said line segments in said row of DRAM;

storing said determined bits referencing said column of said line segments into the least significant bits of said column address register adjacent to said bits previously stored in said column address register;

determining the number of bits needed to address each DRAM in said bank of DRAM; and storing said determined bits needed to address said DRAM in said bank into the least significant bits of said row address register adjacent to said bits previously stored in said row address register.

* * * * *